Figure 1:
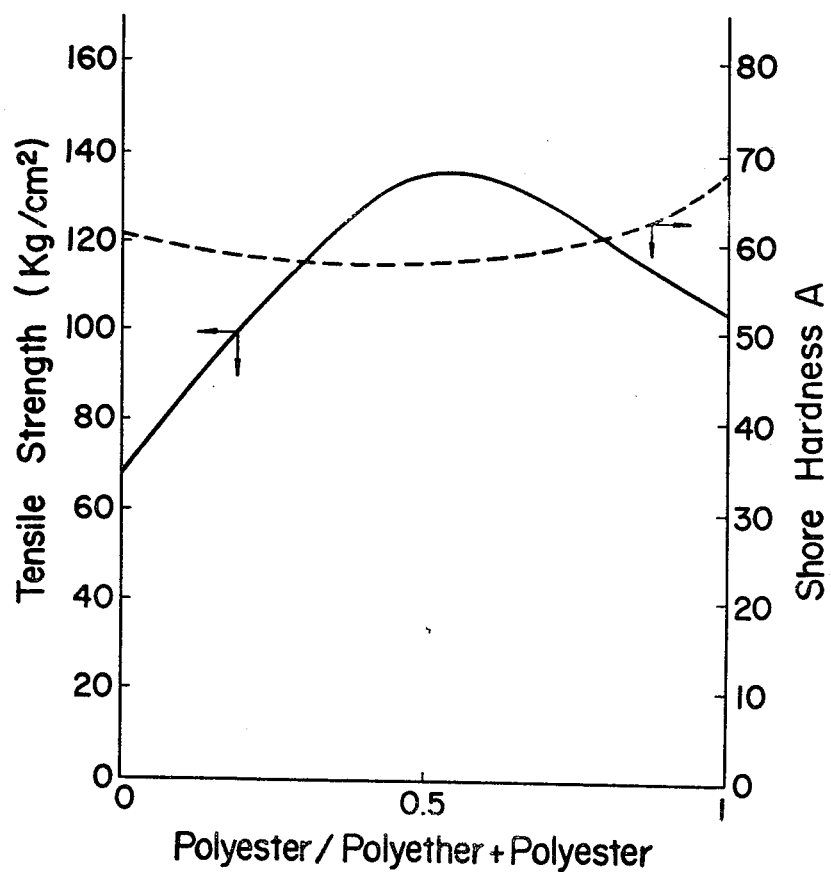

United States Patent [19]

Ibata et al.

[11] 3,960,572

[45] June 1, 1976

[54] PHOTOSENSITIVE COMPOSITIONS COMPRISING A POLYESTER-POLYETHER BLOCK POLYMER

[75] Inventors: Jyoji Ibata; Hidehiko Kobayashi; Kazuo Toyomoto; Kazuhiro Suzuoki; Yoshio Hayashi; Masakazu Kurihara, all of Fuji, Japan

[73] Assignee: Asahi Kasei Kogyo Kabushiki Kaisha, Tokyo, Japan

[22] Filed: Feb. 11, 1974

[21] Appl. No.: 441,547

[30] Foreign Application Priority Data

Feb. 21, 1973 Japan.............................. 48-21033
Apr. 21, 1973 Japan.............................. 48-44646
May 21, 1973 Japan.............................. 48-55510
Oct. 23, 1973 Japan............................ 48-118501

[52] U.S. Cl. ............................... 96/115 P; 96/35.1; 204/159.15; 204/159.19; 204/159.24; 260/75 NK; 260/77.5 CR
[51] Int. Cl.² ........................ G03C 1/68; G03C 5/00
[58] Field of Search ............ 96/115 R, 115 P, 35.1, 96/87 R; 260/75 NK, 859 R, 77.5 R; 204/159.24, 159.15, 159.19

[56] References Cited

UNITED STATES PATENTS

| | | | |
|---|---|---|---|
| 3,509,234 | 4/1970 | Burlant et al................. | 204/159.15 |
| 3,658,531 | 4/1972 | Kurtz..................... | 96/35.1 |
| 3,664,861 | 5/1972 | Okamura et al.................. | 260/77.5 |
| 3,677,920 | 7/1972 | Kai et al. ....................... | 204/159.15 |

FOREIGN PATENTS OR APPLICATIONS 1,272,984   7/1970   United Kingdom

*Primary Examiner*—Edward C. Kimlin
*Attorney, Agent, or Firm*—Burgess, Dinklage & Sprung

[57] ABSTRACT

A photopolymerizable composition comprising a polyester - polyether block polymer which is useful for preparing relief images and printing plates.

12 Claims, 6 Drawing Figures

PHOTOSENSITIVE COMPOSITIONS COMPRISING A POLYESTER-POLYETHER BLOCK POLYMER

BACKGROUND OF THE INVENTION

This invention relates to novel photosensitive compositions. It more particularly refers to polyester-polyether block polymer type photosensitive compositions which are photopolymerizable by the action of actinic light and which are useful in the preparation of relief images, especially relief printing plates.

Unsaturated polyester type photosensitive compositions are already disclosed in, for example, U.S. Pat. No. 2,760,863, and Japanese Pat. Nos. 542,045 and 599,101. Image making articles such as relief plates may be produced by forming a layer of the photosensitive compositions of a desired thickness on a suitable base, exposing the layer to actinic light through, for example, a photographic negative film to photopolymerize the image areas and washing out the non-exposed areas. Relief plates thus obtained may be used as relief printing plates, dry offset printing plates, displays and name plates.

According to these Japanese patents relief printing plates having desired properties can be obtained by suitably selecting the average molecular weight of unsaturated polyesters, the number of ether bonds in the unsaturated polyesters and the type of crosslinking agents. However, with the progress in printing technique printing plates are required to have still higher impact resilience, tear strength, tensile strength, elongation and printing resistance and it has been found difficult to meet these requirements by these methods.

It is known to obtain rubber elastomers by introducing a polyether as a soft segment between two double bonds. It is also known to use a polyether or polyester as the soft segment in the molecular chain of polyurethanes. However, prepolymers containing a polyether along as the soft segment between two double bonds in the molecular chain generally produce relief printing plates having low tensile strength and tear strength and consequently insufficient printing resistance. On the other hand the use of prepolymers containing a polyester alone as the soft segment between two double bonds in the molecular chain slightly improves the tensile strength of relief printing plates as compared with the prepolymers containing a polyether alone as the soft segment but the impact resilience is low and the lack of uniformity in inking and the "fatigue" of plates or deformation of relief images can easily take place. Thus, these defects are fatal especially for flexographic printing plates which require high elastic recovery.

In addition, it is necessary that unexposed portions of photo-sensitive compositions can be readily and easily removed with a solvent liquid. This washing-out property strongly influences the resolution of relief printing plates. The prepolymers containing a polyester alone or a polyether alone as the soft segment do not provide sufficient resolution.

In accordance with this invention, there is provided a photosensitive composition comprising: (1) about 100 parts by weight of at least one prepolymer having a number average molecular weight of about 800 to 20,000 selected from the group consisting of

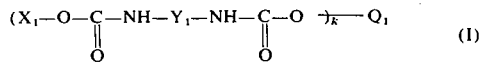

(I)

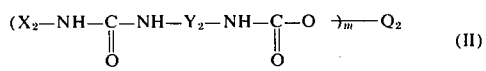

(II)

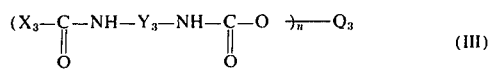

(III)

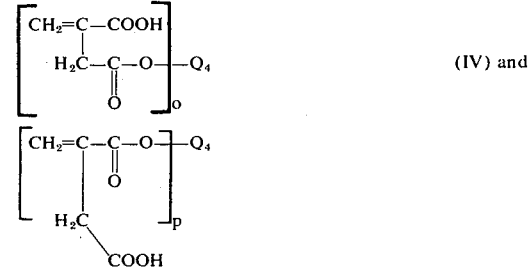

(IV) and

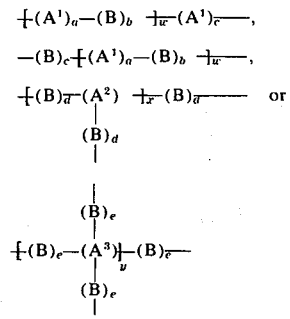

wherein $X_1$ represents a residue of an alcohol having one to three ethylenically unsaturated bonds from which the hydroxy group is excluded;

$X_2$ represents a residue of an amine having one or two ethylenically unsaturated bonds from which the amino group is excluded;

$X_3$ represents a residue of a carboxylic acid having one ethylenically unsaturated bond from which the carboxy group is excluded;

$Y_1, Y_2$, and $Y_3$ represent a residue of a diisocyanate respectively, $Q_1, Q_2, Q_3$ and $Q_4$ each is a residue of a hydroxy terminated block polymer from which the terminal hydroxy groups are excluded and is represented by the formula $$+(A^1)_a—(B)_b \underset{k}{\longrightarrow}(A^1)_r—,$$

$$—(B)_c+(A^1)_a—(B)_b \underset{k}{\longrightarrow},$$

$$+(B)_{\overline{a}}—(A^2) \underset{k}{\longrightarrow}(B)_{\overline{a}} \quad \text{or}$$

$$\begin{array}{c} (B)_d \\ | \\ (B)_e \\ | \\ +(B)_e—(A^3)\!\!\!\!\!\!\!\!\!\!\!\!-(B)_{\overline{a}}— \\ | \\ (B)_e \end{array}$$

i.
($A^1$) represents a residue of a polyetherdiol having a number average molecular weight of about 200 to 5,000 from which the terminal hydroxy groups are excluded;

$A^2$ represents a residue of a polyethertriol having a number average molecular weight of about 500 to 5,000 from which the terminal hydroxy groups are excluded, $A^3$ represents a residue of a polyethertetraol having a number average molecular weight of about 500 to 5,000 from which the terminal hydroxy groups are excluded, B represents a residue of a saturated polyesterdiol having a number average molecular weight of about 200 to 5,000 from which the terminal hydroxy groups are excluded, ii $A^1$ and B; $A^2$ and B; $A^3$ and B; $A^1$ and $A^1$; B and B, each group is linked with a diisocyanate, iii the weight ratio of the total weight of $A^1$ to B, $A^2$ to B, or $A^3$ to B is in the range of from about 1:4 to 4:1, iv. a is an integer from 1 to 4; b is an integer from 1 to 4; c is an integer from 0 to 4; d is an integer from 1 to 3; e is an integer from 1 to 4; x is an integer from 1 to 4; y is 1 or 2; $2 \leq (a+b) w + c \leq 20$, but c is not zero in the case of the prepolymer (IV) or (V); $2 \leq d+x \leq 5$, and when e is 1 or 2, y is k or 2; and when e is 3 or 4, y is 1, l, m, n, o, and p, each is an integer from 2 to 6, and k, m, n, o and p is 2 in the case of $A^1$; k, m, n, o, and p each is an integer from 3 to 6 in the case of $A^2$; and k, m, n, o and p each is 4 or 6 in the case of $A^3$, 2. 0 to about 120 parts by weight of at least polymerizable ethylenically unsaturated monomeric compound; and 3. a photopolymerization initiator in an amount of about 0.001 to 10 weight percent of the total weight of the prepolymer (1) and the polymerizable ethylenically unsaturated monomeric compound (2).

The urethane bonds present in the prepolymer greatly affect the tensile strength, elastic recovery, permanent set or "fatigue" of photo-polymerized articles such as relief printing plates, and as the number of urethane bonds increases the tensile strength and elastic recovery after photopolymerization tend to increase. Especially when the number of urethane bonds which are present between $A^1$ and B; $A^2$ and B; $A^3$ and B increases the permanent set after photopolymerization is remarkably improved. When the number of urethane bonds present in $Q_1$, $Q_2$, $Q_3$ or $Q_4$ is above 40, the hardness and permanent set of photopolymerized articles increase too much to give relief printing plates for practical purposes.

The number average molecular weight of the prepolymer, the number avarage molecular weight of $A^1$, $A^2$, $A^3$ and B, and the total number of urethane bonds which are present between $A^1$ and B; $A^2$ and B; $A^3$ and B; $A^1$ and $A^1$; and B and B greatly affect the properties of photopolymerized articles. Generally, as the number average molecular weight of the prepolymer increases the mechanical properties of the photopolymerized articles such as tensile strength, tear strength and elongation tend to be improved. On the other hand, as the viscosity of the photosensitive composition containing such a prepolymer with an increased number average molecular weight tends to increase, the processability of the photosensitive composition remarkably diminishes. Thus, the number averge molecular weight of the prepolymer of this invention is typically in the range from about 800 to 20,000. When the number average molecular weight is below 800, there cannot be obtained relief printing plates having sufficient tensile strength and elongation. On the other hand the preparation of prepolymers having an number average molecular weight above about 20,000 becomes difficult and the processability of photosensitive compositions containing such prepolymers extremely diminishes.

In order to produce flexographic printing plates having excellent elastic recovery at low hardness as well as excellent tensile strength, tear strength, elongation and printing resistance, it is preferred to use prepolymers having a number average molecular weight of from about 1,300 to 20,000, and more particularly from about 2,000 to 10,000 and comprising residues (B and $A^1$, $A^2$ or $A^3$) of a polyesterdiol and a polyetherdiol, polyetherdiol, polyethertriol or polyethertetraol having a number average molecular weight of from about 500 to 5,000, and more particularly from about 600 to 4,000 from which the terminal hydroxy groups are exclued, and 2 to 20 urethane bonds in total which are present between $A^1$ and B; $A^1$ and $A^1$; B and B; or between $A^2$ and B; and B and B or between $A^3$ and B; and B and B.

Also in order to produce printing plates for general purposes such as newspaper printing having high hardness with small permanent set and good flexibility, it is preferred to use prepolymers having a number average molecular weight of about 800 to 20,000 and comprising residues (B and $A^1$) of a polyesterdiol and a polyetherdiol having a number average molecular weight of from about 800 to 20,000 from which the terminal hydroxy groups are excluded, and 2 to 40 urethane bonds in total which are present between $A^1$ and B; $A^1$ and $A^1$; and B and B.

Furthermore, in order to produce relief printing plates for general purposes having a shore hardness D above 35 and good flexibility from the photosensitive compositions having a relatively low viscosity, it is preferred to use prepolymers having a number average molecular weight of from about 800 to 2,000 and comprising residues (B and $A^1$) of a polyesterdiol and a polyetherdiol having a number average molecular weight of from abut 200 to 500.

Thus, the number average molecular weight of prepolymers, the number average molecular weight of polyesterdiols, polyetherdiols, polyethertriols and polyethertetraols and the total number of the urethane bonds should be chosen depending on the physical properties required for relief structures in accordance with their use and the processability of the photosensitive compositions comprising the prepolymers.

Also the weight ratio of the total weight of $A^1$ to B; $A^2$ to B; or $A^3$ to B, and the kind of $A^1$, $A^2$, $A^3$ and B in the molecular chain of prepolymers greatly affect the tensile strength, tear strength, impact resilience, water resistance and inking of photopolymerized articles and the processability of the photosensitive composition as well as resolution.

In order to obtain good relief printing plates, the weight ratio of the total weight of $A^1$ to B; $A^2$ to B; or $A^3$ to B is in the range of from about 1:4 to 4:1. The preferred range is from 1:4 to 3:1 and the most preferred range is from 1:3 to 2:1.

The polyesterdiols, polyetherdiols polyethertriols and polyethertetraols which may be employed in the preparation of the prepolymers can be produced by conventional methods, and commercially available ones for preparing ordinary urethane resins may be employed in this invention.

The number average molecular weight of the polyesterdiols and polyetherdiols is generally in the range of about 200 to 5,000 and that of the polyethertriols and polyethertetraols is in the range of about 500 to 5,000.

The polyesterdiols are formed by ring opening polymerization of at least one 4-, 6- or 7- membered ring lactone in the presence or absence of a catalyst using a compound such as ethylene glycol.

Examples of suitable 4-, 6- or 7- membered ring lactones include β-propiolactone, α,α′-bis (chloromethyl) propiolactone, γ-butyrolactone, δ-valerolactone, 3,4,5-trimethoxy-δ-valerdactone, ε-caprolactone and the derivatives thereof having the formula

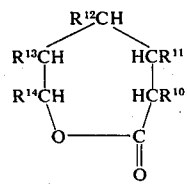

wherein

R[10], R[11], R[12] and R[13], each represents a hydrogen atom, alkyl group having 1 to 4 carbon atoms such as methyl, ethyl isopropyl or n-butyl group, cyclohexyl, methoxy, ethoxy, phanyl or benzyl group;

R[14] represents a hydrogen atom, alkyl group having 1 to 4 carbon atoms such as methyl, ethyl, isopropyl or n-butyl, cyclohexyl, phenyl or benzyl group, and one to three of R[10], R[11], R[12], R[13] and R[14] are hydrogen atoms, including, for examples, γ-methyl-ε-caprolactone and 4-methyl-7-isopropyl-ε-caprolactone.

Also the polyesterdiols are formed by direct esterirication, ester exchange or addition between at least one diol and at least one saturated dicarboxylic acid and/or its anhydride and/or dimethyl or diethyl ester thereof is a mole ratio of OH/COOH > 1.

Examples of suitble diols include ethylene glycol, propylene glycol, 1,3-propanediol, 1,4-butanediol, 1,3-butanediol, 1,2-dimethyl ethylene glycol, 1,5-pentanediol, neopentyl glycol, 1,6-hexanediol, diethylene glycol and dipropylene glycol.

Examples of suitable saturated dicarboxylic acids, anhydrides and methyl or ethyl esters thereof include oxalic acid, malonic acid, methyl malonic acid, succinic acid, methyl succinic acid, glutaric acid, 3-methyl glutaric acid, adipic acid, pimelic acid, suberic acid, azelaic acid, sebacic acid, dimethyl or diethyl esters thereof, and anhydrides thereof.

Typical polyesterdiols are poly-δ-valerolactone diol, poly-ε-caprolactone diol, poly-γ-methyl-ε-caprolactonediol, polyethylene adipatediol, polypropylene adipatediol, polybutylene adipatediol, polyhexamethylene adipatediol and polyethylene succinatediol.

Of these polyesterdiols polypropylene adipatediol is preferably employed for producing flexographic printing plates having low hardness. Als polypropylene adipatediol is effective for preventing the photosensitive composition comprising the prepolymer obtained therefrom from crystalizing at low temperatures due to its low melting point.

Up to about 30 percent by weight of the polyesterdiol may be substituted with polybutadienediols having a number average molecular weight of about 200 to 5,000.

These polyesterdiols may be modified by having their chain lengths extended through reaction with a diisocyanate.

Examples of suitable polyetherdiols are polyethylene glycoldiol, polypropylene glycoldiol, poly-1,4-oxbutylene glycldiol, dihydroxy-terminated ethylene oxide-propylene oxide copolymers (either block copolymers or random copolymers), polyepichlorohydrindiol, polyethylene glycol triol and polyethylene glycol tetraol.

In general, the polyetherdiols, polyethertriols and polyethertetraols are formed by condensation polymerization between ethylene oxide or propylene oxide and a compound having at least two active hydrogens such as ethylene glycol, propylene glycol, glycerine, trimethylolpropane, 1,2,6-hexanetriol, pentaerythritol or ethylene diamine in the presence of an alkali catalyst.

The above-described polyetherdiols may be modified by having their chain lengths extended through reaction with diisocyanate.

Of those polyetherdiols especially when ethylene oxide-propylene oxide copolymers having about 20 to 80 weight percent of ethylene oxide units are employed as the polyetherdiol there can be prepared flexographic printing plates having excellent strength, impact resilience and elastic recovery in spite of extremely low hardness using the photosensitive composition comprising the prepolymer, and also the unexposed portions of the photosensitive composition after photopolymerization can be effectively and advantageously washed out by an aqueous surfactant solution.

The ethylene oxid-propylene oxide copolymers may be either random copolymers or block copolymers but the block copolymers are more preferred in order to obtain the desired effects.

Furthermore, the combination of a polyethylene adipatediol as the polyesterdiol and a dihydroxy-terminated ethylene oxide-propylene oxide copolymer having about 20 to 80 weight percent of ethylene oxide units as the polyetherdiol is especially effective for further lowering of the hardness after photopolymerization of the photosensitive composition comprising the prepolymer obtained therefrom, maintaining the viscosity of photosensitive composition at a low, value preventing the photosensitive composition from crystallizing at low temperatures, simplifying production of printing plates and reducing almost to zero the change in hardness with the lapse of time after photopolymerization of the photosensitive composition. Thus, this combination can provide photosensitive compositions having superior properties for flexographic printing plates.

At least one polyesterdiol or chain-extended polyesterdiol and at least one polyetherdiol or chain-extended polyetherdiol, polyethertriol or polyethetetraol are linked through reaction with a diisocyanate at a temperature of generally about 40°C. to 120°C., and preferably about 50°C. to 100°C in an inert gas atmosphere such as nitrogen gas in the presence or absence of a catalyst in a mole ratio of OH/NCO < 1 or OH/NCO > 1. The catalysts include, for example, tertiary amines such as N,N-dimethylbenzyl amine, N,N-dimethyllaurylamine and triethylene diamine (diazabicyclooctane), and organo-heavy-metal compounds soluble in the reaction system such as ferrous acetoacetate, dibutyltin dilaurate, dibutyltin di-2-hexoate, stannous oleate and stannous octoate.

When the chain-extending reaction is effected in a mole ratio of OH/NCO < 1 the terminals of the chain-extended polymers which are polyesterpolyether block polymers, are isocyanate groups. On the other hand when the chain-extending reaction is effected in a mole ratio of OH/NCO > 1 terminals of the polyester-polyether block polymers are hydroxy groups.

Conventionally the polyester-polyether block polymers are prepared by firstly effecting reaction between a diisocyanate and, for example, a polyesterdiol in a mole ratio of OH/NCO < 1 and secondly effecting reaction between the resulting isocyanate-terminated polyester and a polyetherdiol, polyethertriol or polyethertetraol in a mole ratio of OH/NCO < 1 or OH/NCO > 1. When a polyetherdiol, polyethertriol or polyethertetraol is employed instead of the polyesterdiol in the first reaction, a polyesterdiol is employed in the second reaction.

Exemplary diisocyanates which may be employed in the preparation of the chain-extended polyesterdiols, chain-extended polyetherdiols and polyester-polyether block polymers include 2,4-tolylene diisocyanate, 2,6-toylene diisocyanate, m-phenylene diisocyanate, p-phenylene diisocyanate, 1,3-dimethylphenyl-2,4-diisocyanate, 1,3-dimethylphenyl-4,6-diisocyanate, 1,4-dimethylphenyl-2,5-diisocyanate, 1-chlorophenyl-2,4-diisocyanate, 4,4'-diphenyl diisocyanate, 2,4'-diphenyl diisocyanate, 3,3'-dimethoxy-4,4'- diphenylmethane diisocyanate, 3,3'-dimethyl-4,4'-diphenylmethane diisocyanate, 1,4-naphthylene diisocyanate, 1,5-naphthylene diisocyanate, 2,6-naphthylene diiocyanate, 2,7-naphthylene diiocyanate, p-xylylene diisocyanate, m-xylylene diisocyanate, 1,4-tetramethylene diisocyanate, 1,5-pentamethylene diisocyanate, 1,6-hexamethylene diisocyanate, 1,7-heptamethylene diisocyanate, 1,8-octamethylene diisocyanate, 1,9-nonamethylene diisocyanate, 1,10-decamethylene diisocyanate, 2,2,4-trimethyl-1,5-pentamethylene diisocyanate, 2,2'-dimethyl-1,5-pentamethylene diisocyanate, 3-methoxy-1,6-hexamethylene diisocyanate, 3-butoxy-1,6-hexamethylene diisocyanate, ω, 107'-dipropylether diisocyanate, 1,4-cyclohexyl diiocyanate, 1,3-cyclohexyl diisocyanate and mixtures of these diisocyanates. Also triisocyanates such as triphenylmethane-4,4',4''-triisocyanate, adduct of trimethylolpropane and 2,4-tolylene diisocyanate, adduct of trimethylol-propane and 1,6-hexamethylene diisocyanate may be employed in the similar manner as polyethertriols.

The prepolymers of this invention may be prepared by effecting reaction between the polyester-polyether block polymer whose terminals are isocyanate groups and one compound selected from the group consisting of (I) an alcohol having one to three ethylenically unsaturated bonds, (II) an amine having one to two ethylenically unsaturated bonds and (III) a carboxylic acid having one ethylenically unsaturated bond.

Examples of suitable alcohols (I) include (i) a compound selected from the group consisting of

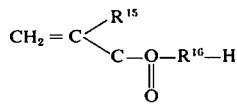

wherein
R$^{15}$ represents a hydrogen atom or methyl group,
R$^{16}$ represents an oxyalkylene group of the formula

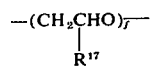

or

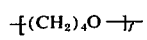

wherein

R$^{17}$ represents a hydrogen atom, methyl, monochloromethyl or monobromomethyl group; and f represents an integer of 1 to 20, ii. trimethylolpropane di-acrylate or -methacrylate, glycerine di-acrylate or -methacrylate and pentaerythritol tri-acrylate or -methacrylate, iii. allyl alcohol, 2-bromoallyl alcohol 2-chloroallyl alcohol, glycerol diallylether, trimethylolpropane diallyl ether and allyl vinyl carbinol, and (iv) 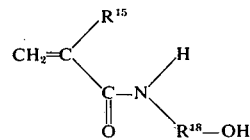

wherein
R$^{15}$ represents a hydrogen atom or methyl group, and
R$^{18}$ represents an alkylene having 1 to 12 carbon atoms.

Examples of suitable compounds (i) include 2-hydroxyethyl acrylate or methacrylate, 2-hydroxypropyl acrylate or methacrylate, 3-bromo-2-hydroxypropyl acrylate or methacrylate, 3-chloro-2-hydroxypropyl acrylate or methacrylate, 4-hydroxy-n-butyl acrylate or methacrylate, diethylene glycol monoacrylate or monomethacrylate, dipropylene glycol monoacrylate or monomethacrylate, dibutylene glycol monoacrylate or methacrylate, tetraethylene glycol monoacrylate or methacrylate, monoacrylates or methacrylates of polyoxyethylene diols having a number average molecular weight of about 200 to 900, monoacrylates or monomethacrylates of polyoxypropylene diols having a number average molecular weight of about 200 to 1,200 and monoacrylates or monomethacrylates of polyoxybutylene diols having a number average molecular weight of about 200 to 1,500, 3-bromo-2-hydroxypropyl acrylate or methacrylate, 3-chloro-2-hydroxypropyl acrylate or methacrylate and

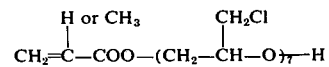

Of all compounds (i) when a compound of the formula

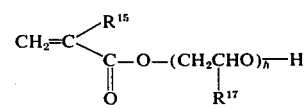

wherein
R$^{15}$ and R$^{17}$ are the same as defined above; and $h$ is an integer of 2 to 20 and especially 4 to 10, is used, there can be obtained printing plates having excellent impact resilience at low hardness which are useful for flexographic printing on corrugated cardboards. Furthermore, the prepolymers containing the residue of the compound represented by this formula can be more readily and easily washed out by an aqueous alkali solution or an aqueous surfactant solution and accordingly the resolution can be remarkably improved. Also the resulting photopolymerized articles have excellent resistance to water.

Examples of suitable compounds (iv) include N-methylol acrylamide or methacrylamide, 2-hydroxyethyl acrylamide or methacrylamide, 2-hydroxypropyl acrylamide or methacrylamide 4-hydroxy-n-butyl acrylamide or methacrylamide and the products obtained by ester-amide exchange reaction between methyl acrylate or methacrylate and an amino alcohol having at most 12 carbon atoms.

Examples of suitable amines (II) are allylamine and diallylamine.

Examples of suitable carboxylic acids (III) are acrylic acid, methacrylic acid and itaconic acid.

The prepolymers of this invention may also be prepared by effecting reaction between the polyester-polyether block copolymer whose terminals are hydroxy groups and a compound selected from the group consisting of (IV) and/or (V) itaconic anhydride and acrylic acid, methacrylic acid, acrylic anhydride, methacrylic anhydride, acrylic chloride and methacrylic chloride.

The photosensitive compositions of this invention comprise at least one prepolymer and a photopolymerization initiation in an amount of about 0.001 to 10 weight percent of the prepolymer.

The photosensitive compositions may contain at least one polymerizable ethylenically unsaturated monomeric compound in an amount up to about 120 parts by weight based on 100 parts by weight of the prepolymer.

Examples of suitable polymerizable ethylenically unsaturated monomeric compounds include a. compounds of the formula $$CH_2=C\begin{smallmatrix}R^{15}\\C-O-R^{22}\\\parallel\\O\end{smallmatrix}$$

wherein
$R^{15}$ represents a hydrogen atom or methyl group;
$R^{22}$ represents an alkyl group having 1 to 18 carbon atoms, cyclohexyl, alkoxyalkyl group having at most 15 carbon atoms, cyanoalkyl group having at most 8 carbon atoms, tertiary amino alkyl group having at most 18 carbon atoms, hydrogen atom or oxyalkylene group of the formula $$-(CH_2CHO)_{\overline{f}}-H \text{ or } -((CH_2)_4O)_{\overline{f}} H$$
$$\qquad\quad|$$
$$\qquad R^{17}$$

wherein $R^{17}$ represents a hydrogen atom, monochloromethyl or monobromomethyl group; and $f$ represents an integer from 1 to 20, b. compounds of the formula $$CH_2=C\begin{smallmatrix}R^{15}\\C-N\\\parallel\\\quad O\end{smallmatrix}\begin{smallmatrix}R^{23}\\\\R^{24}\end{smallmatrix}$$

wherein
$R^{15}$ represents a hydrogen atom or methyl group;
$R^{23}$ and $R^{24}$ each represents a hydrogen atom, alkyl group having 1 to 12 carbon atoms, cyclohexyl, benzyl, $-R^{18}-OH$ in the case of $R^{23}$ being a hydrogen atom, wherein
$R^{18}$ represents an alkylene having 1 to 12 carbon atoms, c. compounds of the formula $$\left[CH_2=C\begin{smallmatrix}R^{15}\\C-O\\\parallel\\O\end{smallmatrix}\right]_g R^{25}$$

wherein
$R^{15}$ represents a hydrogen or methyl group; g is an integer from 2 to 4, and $R^{15}$ represents a radical of 2 polyol having g terminal hydroxy groups and a number average molecular weight of at most 1,000, d. compounds of the formula $$CH_2=C\begin{smallmatrix}R^{15}\\C-NH-R^{26}-NH-C\\\parallel\\O\end{smallmatrix}\begin{smallmatrix}R^{27}\\C=CH_2\\\parallel\\O\end{smallmatrix}$$

wherein
$R^{15}$ and $R^{27}$ each represents a hydrogen atom or methyl group;
$R^{26}$ represents an alkylene group having up to 6 carbon atoms, e. compounds of the formula $$CH_2=C\begin{smallmatrix}R^{15}\\C-O-CH_2-CH-O-P-OH\\\parallel\qquad\qquad\quad|\qquad\quad\parallel\\O\qquad\qquad R^{28}\qquad O\\\qquad\qquad\qquad\qquad\quad OH\end{smallmatrix}$$

wherein
$R^{15}$ represents a hydrogen atom or methyl group;
$R^{28}$ represents a hydrogen atom, methyl group, monochloromethyl or monobromomethyl group;

f. aromatic compounds having at least one $CH_2=C<$ group and one benzene nucleus; and g. other ethylenically unsaturated monomeric compounds.

Exemplary compounds (a) include methyl acrylate or methacrylate, ethyl acrylate or methacrylate, isopropyl acrylate or methacrylate, n-butyl acrylate or methacrylate, n-pentyl acrylate or methacrylate, n-octyl acrylate or methacrylate, 2-ethylhexyl acrylate or methacrylate, cyclohexyl acrylate or methacrylate, lauryl acrylate or methacrylate, isodecyl acrylate or methacrylate; methoxymethyl acrylate, ethoxybutyl acrylate or methacrylate, 2-methoxypropyl acrylate or methacrylate, n-butoxymethyl acrylate or methacrylate; cyanomethyl acrylate or methacrylate, cyanobutyl acrylate or methacrylate; (N,N-dimethylamino)methyl acrylate or methacrylate, 2-(N,N-dimethylamino)ethyl acrylate or methacrylate, 2-(N,N-diethylamino)ethyl acrylate or methacrylate, 2-(N,N-benzylamino)ethyl acrylate or methacrylate, 2-(N,N-diethylamino) propyl acrylate or methacrylate; acrylic acid, methacrylic acid, and the same compounds (i) as described afore.

Of these compound when about 10 to 100 parts by weight, based on 100 parts by weight of the prepolymer, of a compound of the formula

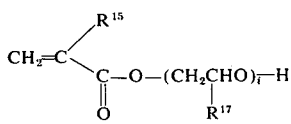

wherein

R$^{15}$ and R$^{17}$ are the same as defined hereinabove; and
$i$ represents an integer from 2 to 10 is employed, the resulting photopolymerized articles have superior impact resilience and elastic recovery. Especially desirable results are realized when i is an integer from 4 to 6 in the above-described formula.

Exemplary compounds (b) include acrylamide, methacrylamide, N,N-dimethyl acrylamide or methacrylamide, N,N-diethyl acrylamide or methacrylamide, N,N-diisopropyl acrylamide or methacrylamide, N,N-didecylacrylamide or methacrylamide, N-isopropyl acrylamide or methacrylamide, N-cyclohexyl acrylamide or methacrylamide, N-benzyl acrylamide or methacrylamide, and the same compounds (iv) as described above.

Exemplary compounds (c) include ethyleneglycol di-acrylate or -methacrylate, diethyleneglycol di-acrylate or -methacrylate, triethyleneglycol di-acrylate or -methacrylate, tetraethyleneglycol di-acrylate or -methacrylate, polyethyleneglycol (number average molecular weight: 200 to 1,000)di-acrylate or -methacrylate, propyleneglycol di-acrylate or -methacrylate, dipropyleneglycol di-acrylate or -methacrylate, polypropyleneglycol (number average molecular weight: 100 to 1,000) di-acrylate or -methacrylate, butyleneglycol di-acrylate or -methacrylate, trimethylolethane tri-acrylate or -methacrylate, trimethylolpropane tri-acrylate or -methacrylate and pentaerythritol tetra-acrylate or -methacrylate.

Exemplary compounds (d) include N,N'-methylenebisacrylamide, N,N'-methylenebis-methacrylamide, N,N'-trimethylenebisacrylamide, N,N'-trimethylenebismethacrylamide, N,N'-hexamethylenebisacrylamide and N,N'-hexamethylenebismethacrylamide.

Exemplary compounds (e) include 2-acid phosphoxyethyl acrylate or methacrylate, 3-chloro-2-acid phosphoxypropyl acrylate or methacrylate and 3-bromo-2-acid phosphoxypropyl acrylate or methacrylate.

These compounds increase the photosensitivity of the photosensitive compositions and prevent the photosensitive compositions from diminishing in photosensitivity with the lapse of time, and furthermore improve the inking of photopolymerized articles especially having a Shore hardness D of more than 35. These compounds are preferably employed in an amount of about 0.001 to 1 parts by weight based on 100 parts of the prepolymer.

Exemplary compounds (f) include styrene, alpha-methylstyrene, alpha-chlorostyrene, p-tert-butylstyrene, p-sec-butylstyrene, aminostyrene, methoxystyrene, vinyltoluene, vinylbenzoic acid, vinylphenol, allylbenzene, allyltoluene, monoallylphthalate, divinylbenzene.

Exemplary compounds (g) include vinylacetate, vinylpropionate, vinyllaurate, methylvinyl benzoate, beta-hydroxyethyl vinyl benzoate, vinyl succinate, vinyl adipate, divinylphthalate, divinylterephthalate, and the same alcohols (ii) as described above.

The amount and kind of the polymerizable ethylenically unsaturated monomeric compounds are suitably selected depending upon the properties of photopolymerized articles in accordance with their use and the processability of the photosensitive compositions containing such monomeric compounds.

It is necessary that the reaction of photosensitive compositions is initiated only by the action of actinic light and that they are thermally stable. Therefore, preferably polymerization initiators are thermally inactive below 40°C and initiate photopolymerization upon irradiation with actinic light.

Exemplary photopolymerization initiators include benzoins such as benzoin, benzoin methyl ether, benzoin ethyl ether, benzoin isopropyl ether, alpha-methylbenzoin, alpha-ethylbenzoin, alpha-methyl benzoin methyl ether, alpha-phenylbenzoin, alpha-allylbenzoin; anthraquinones such as anthraquinone, chloroanthraquinone, methylanthraquinone, ethylanthraquinone, tertiary butylanthraquinone; diketones such as benzil, diacetyl; phenones such as acetophenone, benzophenone, omega-bromoacetophenone; 2-naphthalene sulfonyl chloride; disulfides such as diphenyl disulfide, tetraethylthiouram disulfide; dyes such as Eosin G (C.I. 45380) and Thionine (C.I. 52025); and the like.

These photopolymerization initiators are typically used in an amount of from 0.001 to 10 weight percent, and preferably about 0.01 to 4 weight percent of the total weight of the prepolymer and the polymerizable ethylenically unsaturated monomeric compound.

Known stabilizers may be employed for the purpose of maintaining storage stability (shelf life) of the photosensitive compositions. Such stabilizers may be added when the components of a photosensitive composition are admixed or may be added to each component separately prior to admixing of the components.

Exemplary stabilizers include hydroquinone, monotert-butyl hydroquinone, 2,5-di-tert-butyl hydroquinone, catechol, tert-butyl catechol, benzoquinone, 2,5-diphenyl-p-benzoquinone, p-methoxy phenol, picric acid and di-p-fluorophenylamine.

These stabilizers are added only for preventing thermal polymerization without the actinic radiation set forth above without restraining the photopolymerization reaction. Consequently the amount of the stabilizers may be preferably about 0.001 to 2.0 percent by weight of the total weight of the prepolymer and the polymerizable ethylenically unsaturated monomeric compound.

Furthermore, various compounds such as plasticizers and softeners may be incorporated into the photosensitive compositions in order to improve the mechanical properties after photopolymerization. These compounds include, for example, dioctylphthalate, butylphthalyl butylene glycolate, polyester type plasticizers, epoxy type plasticizers, various phosphates and polyethers such as polypropylene glycol.

The photosensitive compositions may additionally contain unsaturated polyester type prepolymers and polyethers having a number average molecular weight of from about 1,000 to 20,000 and polymerizable ethylenic double bonds such as copolymers of propylene oxide and allyl glycidyl ether.

The photosensitive compositions of this invention are photopolymerized by actinic radiation having wave lengths of 2,000 to 8,000 Angstroms. Practical sources of such actinic radiation include carbon arc lamps, super high pressure mercury lamps, high pressure mercury lamps, low pressure mercury lamps, xenon lamps, ultra violet fluorescent lamps and sunlight.

When the photosensitive compositions of this invention are exposed to actinic light through a process transparency, e.g., a negative or positive film, the areas corresponding to the transparent image portions are photopolymerized in about 1 second to 60 minutes and the non-image areas, i.e. unexposed areas, remain substantially unphotopolymerized. These non-exposed areas may be washed away with a solvent liquid such as water, an aqueous solution, an aqueous surfactant solution or an organic solvent. Exemplary solvent liquids include aqueous solutions of sodium hydroxide, potassium hydroxide, calcium hydroxide, ammonium hydroxide, sodium carbonate, sodium bicarbonate, potassium carbonate, hydrochloric acid, sulfuric acid, nitric acid, acetic acid; aqueous solutions of methanol, ethanol, isopropanol and acetone; methanol, ethanol, isopropanol, acetone, methylethyl ketone, ethyl acetate, butyl acetate, dioxane, tetrahydrofurane, phenol, ether, benzene, toluene, gasoline, kerosene, light oil, trichloroethylene or mixtures thereof; an aqueous solution of surfactants such as anionic, cationic, amphoteric or nonionic surfactants. Of these surfactants it is preferred to use anionic surfactants such as sodium or potassium salt of saturated or unsaturated fatty acids having 12 to 18 carbon atoms or alkylbenzene sufonic acids.

One of the characteristics of this invention is that the photosensitive compositions according to this invention can be washed out by such aqueous surfactant solutions.

For example a relief printing plate may be prepared by placing a process transparency, e.g., a negative film, on a glass sheet transparent to actinic light, covering the negative film with a film transparent to actinic light such as polyester film, depositing the photosensitive composition upon the film to form a layer of 0.1 mm to 10 mm. in thickness, placing a base or support material such as polyester film on the layer according to the process and apparatus described in German DOS Pat. No. 2,029,238, putting a glass sheet transparent to actinic light on the support material, exposing the resulting assembly to actinic light, first from the support material side, second from the negative film side or simultaneously from the support material side and the negative film side or from the negative film side in case of metal support materials or opaque support materials, removing the glass sheets, the negative film and the film covering the negative film from the assembly, washing out the unexposed portions of the layer, drying the resulting relief printing plate and, if necessary, postexposing the whole relief printing plate.

Examples of suitable base or support materials include metals such as steel and aluminum plates, sheets and foils and plastics such as polyester, polyamide, polyvinylchloride, polyvinylidenechloride, polymethylmethacrylate, polystyrene and cellulose ester films and plates. These support materials may be either transparent or opaque to actinic light. The thickness of these support materials is preferably in the range of 0.1 mm. to 2.0 mm. for metal plates, sheets and foils and preferably in the range of 50 microns to 2 mm. for plastic films and plates.

SYNTHESES 1

200 g. of polypropylene glycol diol having a number average molecular weight of about 2000 were reacted with 34.8 g. of a mixture of 2,4-tolylene diisocyanate and 2,6-tolylene diisocyanate in a weight ratio of 80 to 20 in the presence of 0.5 g. of dibutyltin dilaurate at 70°C. for 2 hours under a nitrogen atmosphere with stirring to give an isocyanate-terminated polypropylene glycol. Then the resulting polypropylene glycol was further reacted with 400 g. polyethylene adipate diol having a number average molecular weight of about 2000 at 70°C. for 2 hours under a nitrogen atmosphere with stirring to give a hydroxy-terminated polyetherpolyester block polymer having a number average molecular weight of about 6380.

Then 638 g. of the polyether-polyester block polymer were reacted with 24.0 g. of itaconic anhydride in the presence of 0.3 g. of hydroquinone as the radical polymerization inhibitor at 130°C. for 3 hours and then at 150°C. for 10 hours to give a prepolymer.

SYNTHESES 2

200 g. of polyethylene adipate diol having a number average molecular weight of about 2000 were reacted with 34.8 g. of a mixture of 2,4-tolylene diisocyanate and 2,6-tolylene diisocyanate in a weight ratio of 80 to 20 in the presence of 0.5 g. of dibutyltin dilaurate at 70°C. for 2 hours under a nitrogen atmosphere with stirring to give an isocyanate-terminated polyethylene adipate. Then the resulting polyethylene adipate was further reacted with 100 g. of polypropylene glycol diol having a number average molecular weight of about 2000 at 70°C. for 2 hours under a nitrogen atmosphere with stirring to give an isocyanate-terminated polyester-polyether block polymer having a number average molecular weight of about 6500. Then 300 g. of the resulting polyester-polyether block polymer were reacted with 25 g. of 2-hydroxyethyl methacrylate in the presence of 0.1 g. of hydroquinone at 70°C. for 2 hours to give a prepolymer.

SYNTHESIS 3

200 g. of polyethylene adipate diol having a number average molecular weight of about 2000 were reacted with 26.1 g. of a mixture of 2,4-tolylene diisocyanate and 2,6-tolylene diisocyanate in a weight ratio of 80 to 20 in the presence of 0.5 g. of dibutyltin dilaurate at 70°C. for 2 hours under a nitrogen atmosphere with stirring to give an isocyanate-terminated polyethylene adipate having a number average molecular weight of about 4,500. Then to the resulting polyethylene adipate there were added 25 g. of 2-hydroxyethyl methacrylate and 0.1 g. of hydroquinone and the mixture was subjected to reaction at 70°C. for 2 hours to give a prepolymer.

SYNTHESIS 4

200 g. of polypropylene glycol diol having a number average molecular weight of about 2,000 were reacted with 26.1 g. of a mixture of 2,4-tolylene diisocyanate and 2,6-tolylene diisocyanate in a weight ratio of 80 to 20 in the presence of 0.5 g. of dibutyltin dilaurate at 70°C. for 2 hours under a nitrogen atmosphere with stirring to give an isocyanate-terminated polypropylene glycol having a number average molecular weight of about 4300. Then the resulting polypropylene glycol was further reacted with 25 g. of 2-hydroxyethyl methacrylate in the presence of 0.1 g. of hydroquinone at 70°C. for 2 hours to give a prepolymer.

SYNTHESIS 5

200 g. of polyethylene adipate diol having number average molecular weight of about 2000 were reacted with 8.7 g. of a mixture of 2,4-tolylene diisocyanate and 2,6-tolylene diisocyanate in a mole ratio of 80 to 20 in the presence of 0.3 g. of dibutyltin dilaurate at 70°c. for 2 hours under a nitrogen atmosphere with stirring to give a polyethylene adipate glycol diol having a number average molecular weight of about 4210. Then 421 g. of the resulting polyethylene adipate diol was reacted with 24.0 g. of itaconic anhydride in the presence of 0.3 g. of hydroquinone at 130°C. for 3 hours and then at 150°C. for 10 hours to give a prepolymer.

SYNTHESIS 6

200 g. of polypropylene glycol diol having a number average molecular weight of about 2000 were reacted with 8.7 g. of a mixture of 2,4-tolylene diisocyanate and 2,6-tolylene diisocyanate in a weight ratio of 80 to 20 in the presence of 0.3 g. of dibutyltin dilaurate at 70°C. for 2 hours under a nitrogen atmosphere with stirring to give a hydroxy-terminated polypropylene glycol. Then 420 g. of the resulting polypropylene glycol was reacted with 24.0 g. of itaconic anhydride in the presence of 0.3 g. of hydroquinone at 130°C. for 3 hours and then at 150°C. for 10 hours to give a prepolymer.

SYNTHESIS 7

200 g. of polypropylene glycol diol having a number average molecular weight of about 2,000 were reacted with 34.8 g. of a mixture of 2,4-tolylene diisocyanate and 2,6-tolylene diisocyanate in a weight ratio of 80 to 20 in the presence of 0.5 g. of dibutyltin dilaurate at 70°C. for 2 hours with stirring under a nitrogen atmosphere to give an isocyanate-terminated polypropylene glycol.

Separately, 100 g. of polyethylene adipate diol having a number average molecular weight of 1,000 were reacted with 8.7 g. of a mixture of 2,4-tolylene diisocyanate and 2,6-tolylene diisocyanate in a weight ratio of 80 to 20 in the presence of 0.2 g. of dibutyltin dilaurate at 70°C. for 2 hours under a nitrogen atmosphere with stirring to give a hydroxy-terminated polyethylene adipate having a number average molecular weight of about 2,250. Then the isocyanate-terminated polypropylene glycol was uniformly mixed with the hydroxy-terminated polyethylene adipate and the resulting mixture was reacted at 70°C. for 2 hours to give an isocyanate-terminated polyether-polyester block polymer having a number average molecular weight of about 6720.

300 g. of the resulting isocyanate-terminated polyether-polyester block polymer was reacted with 25 g. of 2-hydroxyethyl methacrylate at 70°C. for 2 hours in the presence of 0.1 g. of hydroquinone under a nitrogen atmosphere to give a prepolymer.

SYNTHESIS 8

200 g. of polyethylene adipate diol having a number average molecular weight of about 2,000 were reacted with 34.8 g. of a mixture of 2,4-tolylene diisocyanate and 2,6-tolylene diisocyanate in a weight ratio of 80 to 20 in the presence of 0.5 g. of dibutyltin dilaurate at 70°C. for 2 hours under a nitrogen atmosphere with stirring to give an isocyanate-terminated polyethylene adipate.

Then to the resulting polyethylene adipate there was added 100 g. of polyethylene glycol diol having a number average molecular weight of about 1,000 and 8.7 g. of a mixture of 2,4-tolylene diisocyanate and 2,6-tolylene diisocyanate in a weight ratio of 80 to 20 and the mixture was thoroughly mixed and was subjected to reaction at 70°C. for 2 hours with stirring under a nitrogen atmosphere to give an isocyanate-terminated polyether-polyester block polymer having a number average molecular weight of about 6,580.

300 g. of the resulting block polymer was reacted with 25 g. of 2-hydroxyethyl methacrylate at 70°C. for 2 hours in the presence of 0.1 g. of hydroquinone under a nitrogen atmosphere to give a prepolymer.

SYNTHESIS 9

200 g. of polypropylene glycol diol having a number average molecular weight of about 2,000 were reacted with 34.8 g. of a mixture of 2,4-tolylene diisocyanate and 2,6-tolylene diisocyanate in a weight ratio of 80 to 20 in the presence of 0.5 g. of dibutyltin dilaurate at 70°C. for 2 hours under a nitrogen atmosphere with stirring to give an isocyanate-terminated polypropylene glycol.

Then to the resulting polypropylene glycol there were added 100 g. of polyethylene adipate diol having a number average molecular weight of about 1,000. There were added 8.7 g. of a mixture of 2,4-tolylene diisocyanate and 2,6-tolylene diisocyanate in a weight ratio of 80 to 20 and the mixture was thoroughly mixed and was subjected to reaction at 70°C. for 2 hours to give an isocyanate-terminated polyether-polyester block polymer having a number average molecular weight of about 6,750.

300 g. of the resulting polyether-polyester block polymer was reacted with 25 g. of 2-hydroxyethyl methacrylate at 70°C. for 2 hours in the presence of 0.1 g. of hydroquinone under a nitrogen atmosphere to give a prepolymer.

SYNTHESIS 10

200 g. of polyethylene adipate diol having a number average molecular weight of about 2,000 were reacted with 34.8 g. of a mixture of 2,4-tolylene diisocyanate and 2,6-tolylene diisocyanate in a weight ratio of 80 to 20 in the presence of 0.5 g. of dibutyltin dilaurate at 70°C. for 2 hours with stirring under a nitrogen atmosphere to give an isocyanate-terminated polyethylene adipate. Then the resulting polyethylene adipate was further reacted with 133 g. of polypropylene glycol diol having a number average molecular weight of about 2,000 at 70°C. for 2 hours with stirring under a nitrogen atmosphere to give an isocyanate-terminated polyester-polyether block polymer having a number average molecular weight of about 13,000. Then 300 g. of the block polymer was reacted with 25 g. of 2-hydroxyethyl methacrylate in the presence of 0.1 g. of hydroquinone at 70°C. for 2 hours to give a prepolymer.

SYNTHESIS 11

To 200 g. of dihydroxy-terminated ethylene oxide-propylene oxide block copolymer having a number average molecular weight of about 2,000 and 35 weight percent of ethylene oxide units there were added 34.8 g. of a mixture of 2,4-tolylene diisocyanate and 2,6-tolylene diisocyanate in a weight ratio of 80 to 20 and 0.5 g. of dibutyltin dilaurate and the mixture was subjected to reaction at 70°C. for 2 hours with stirring under a nitrogen atmosphere to give an isocyanate-terminated ethylene oxide-propylene oxide copolymer. Then to the resulting copolymer there were added 400 g. of polyethylene adipate diol having a number average molecular weight of about 2,000 and the mixture was subjected to reaction at 70°C. for 2 hours with stirring under a nitrogen atmosphere to give hydroxy-terminated (polyester)-(ethylene oxide-propylene oxide copolymer) block polymer having a number average molecular weight of about 6,410.

Then 641 g. of the resulting block polymer were reacted with 24.0 g. of itaconic anhydride in the presence of 0.3 g. of hydroquinone at 100°C. for 4 hours, at 130°C. for 3 hours and then at 150°C. for 10 hours to give a prepolymer.

SYNTHESIS 12

200 g. of polyethylene adipate diol having a number average molecular weight of about 2,000 were reacted with 34.8 g. of 2,4-tolylene diisocyanate and 2,6-tolylene diisocyanate in a weight ratio of 80 to 20 in the presence of 0.5 g. of dibutyltin dilaurate at 70°C. for 2 hours with stirring under a nitrogen atmosphere to give an isocyanate-terminated polyethylene adipate. Then to the resulting polyethylene adipate there were added 100 g. of dihydroxy-terminated ethylene oxide-propylene oxide block copolymer having a number average molecular weight of about 2,000 and 35 weight percent of ethylene oxide units and the mixture was subjected to reaction at 70°C. for 2 hours with stirring under a nitrogen atmosphere to give an isocyanate-terminated (ethylene oxide-propylene copolymer)-(polyester) block polymer having a number average molecular weight of about 6,600.

Then 300 g. of the resulting block polymer was reacted with 25 g. of 2-hydroxyethyl methacrylate in the presence of 0.1 g. of hydroquinone at 70°C. for 2 hours with stirring under a nitrogen atmosphere to give a prepolymer.

SYNTHESIS 13

To 200 g. of dihydroxy-terminated ethylene oxide-propylene oxide block copolymer having a number average molecular weight of about 2,000 and 35 weight percent of ethylene oxide units there were added 34.8 g. of a mixture of 2,4-tolylene diisocyanate and 2,6-tolylene diisocyanate in a weight ratio of 80 to 20 and 0.5 g. of dibutyltin dilaurate and the mixture was subjected to reaction at 70°C. for 2 hours with stirring under a nitrogen atmosphere to give an isocyanate-terminated ethylene oxide-propylene oxide copolymer.

Separately, to 200 g. of polyethylene adipate diol there were added 8.7 g. of a mixture of 2,4-tolylene diisocyanate and 2,6-tolylene diisocyanate in a weight ratio of 80 to 20 and 0.3 g. of dibutyltin dilaurate and the mixture was subjected to reaction at 70°C. for 2 hours to give a hydroxy-terminated polyester having a number average molecular weight of about 4,200.

Then the resulting isocyanate-terminated ethylene oxide-propylene oxide copolymer and the resulting hydroxy-terminated polyester were uniformly and sufficiently mixed at 70°C. to give an isocyanate-terminated (ethylene oxide-propylene oxide copolymer)-(polyester) block polymer. Then 300 g. of the resulting block polymer was reacted with 25 g. of 2-hydroxyethyl methacrylate in the presence of 0.1 g. of hydroquinone at 70°C. for 2 hours with stirring to give a prepolymer having a number average molecular weight of about 8,920.

SYNTHESIS 14

40 g. of polypropylene glycol diol having a number average molecular weight of about 400 were reacted with 34.8 g. of a mixture of 2,4-tolylene diisocyanate and 2,6-tolylene diisocyanate in a weight ratio of 80 to 20 in the presence of 0.1 g. of dibutyltin dilaurate at 70°C. for 2 hours under a nitrogen atmosphere with stirring to give an isocyanate-terminated polypropylene glycol. Then, the resulting polypropylene glycol was further reacted with 80 g. of polyethylene glycol having a number average molecular weight of about 400 at 70°C. for 2 hours under a nitrogen atmosphere with stirring to give a hydroxy-terminated polyether-polyester block polymer having a number average molecular weight of about 1,500. 150 g. of the resulting block polymer were reacted with 24.0 g. of itaconic anhydride in the presence of 0.3 g. of hydroquinone as the radical polymerization inhibitor at 130°C. for 3 hours and then at 150°C. for 10 hours with stirring to give a prepolymer.

SYNTHESIS 15

30 g. of polyethylene glycol diol having a number average molecular weight of 300 were reacted with 34.2 g. of a mixture of 2,4-tolylene diisocyanate and 2,6-tolylene diisocyanate in a weight ratio of 80 to 20 in the presence of 0.05 g. of dibutyltin dilaurate at 70°C. for 2 hours under a nitrogen atmosphere with stirring to give an isocyanate-terminated polyethylene glycol. Then, the resulting polyethylene glycol was further reacted with 15 g. of polyethylene adipate diol having a number average molecular weight of about 300 at 70°C. for 2 hours under a nitrogen atmosphere with stirring to give a hydroxy-terminated polyethylene-polyester block polymer having a number average molecular weight of about 1,500.

70 g. of the resulting block polymer were reacted with 25 g. of 2-hydroxyethyl methacrylate in the presence of 0.1 g. of hydroquinone at 70°C. for 2 hours to give a prepolymer.

SYNTHESIS 16

40 g. of polyethylene adipate diol having a number average molecular weight of about 400 were reacted with 26.1 g. of a mixture of 2,4-tolylene diisocyanate and 2,6-tolylene diisocyanate in a weight ratio of 80 to 20 in the presence of 0.1 g. of dibutyltin dilaurate at 70°C. for 2 hours under a nitrogen atmosphere with stirring to give an isocyanate-terminated polyethylene adipate having a number average molecular weight of about 1,300. To the resulting polyethylene adipate there were added 25 g. of 2-hydroxyethyl methacrylate and 0.1 g. of hydroquinone and the mixture was subjected to reaction at 70°C. for 2 hours to give a prepolymer.

SYNTHESIS 17

40 g. of polyethylene glycol diol having a number average molecular weight of about 400 were reacted with 26.1 g. of a mixture of 2,4-tolylene diisocyanate and 2,6-tolylene diisocyanate in a weight ratio of 80 to 20 in the presence of 0.1 g. of dibutyltin dilaurate at 70°C. for 2 hours with stirring under a nitrogen atmosphere to give an isocyanate-terminated polyethylene glycol having a number average molecular weight of about 1,350. To the resulting polethylene glycol there were added 25 g. of 2-hydroxyethyl methacrylate and 0.1 g. of hydroquinone and the mixture was subjected to reaction at 70°C. for 2 hours to give a prepolymer.

SYNTHESIS 18

300 g. of polyethylene adipate diol having a number average molecular weight of about 1,000 were reacted with 104.4 g. of a mixture of 2,4-tolylene diisocyanate and 2,6-tolylene diisocyanate at a weight ratio of 80 to 20 in the presence of 0.3 g. of dibutyltin dilaurate at 70°C. for 2 hours with stirring under a nitrogen atmosphere to give an isocyanate-terminated polyethylene adipate. Then the resulting polyethylene adipate was further reacted with 150 g. of polyethylene glycol triol having a number average molecular weight of about 1,500 at 70°C. for 2 hours with stirring under a nitrogen atmosphere to give an isocyanate-terminated polyether-polyester block polymer having a number average molecular weight of about 5,600. Then 300 g. of the resulting polyether-polyester block prepolymer were reacted with 25 g. of 2-hydroxyethyl methacrylate in the presence of 0.1 g. of hydroquinone at 70°C. for 2 hours to give a prepolymer.

SYNTHESIS 19

400 g. of polyethylene adipate diol having a number average molecular weight of about 1,000 were reacted with 139.2 g. of a mixture of 2,4-tolylene diisocyanate and 2,6-tolylene diisocyanate at a weight ratio of 80 to 20 in the presence of 0.2 g. of dibutyltin dilaurate at 70°C. for 2 hours with stirring under a nitrogen atmosphere to give an isocyanate-terminated polyethylene adipate. Then the resulting polyethylene adipate was further reacted with 200 g. of polyethylene glycol tetraol having a number average molecular weight of about 2,000 at 70°C. for 2 hours with stirring under a nitrogen atmosphere to give an isocyanate-terminated polyether-polyester block polymer having a number average molecular weight of about 7,400. Then 300 g. of the resulting polyether-polyester block polymer was reacted 25 g. of 2-hydroxyethyl methacrylate in the presence of hydroquinone at 70°C. for 2 hours to give a prepolymer.

SYNTHESIS 20

300 g. of the same isocyanate-terminated polyester-polyether block polymer having a number average molecular weight of about 6,500 as in synthesis 2 were reacted with 40 g. of each of trimethylolpropane dimethacrylate, allyl alcohol and 2-hydroxyethyl acrylamide in the presence of 0.1 g. of hydroquinone at 70°C. for 2 hours to give prepolymers.

SYNTHESIS 21

325 g. of the same isocyanate-terminated polyether-polyester block polymer having a number average molecular weight of about 6,500 as in Synthesis 2 were reacted with 6 g. of allylamine, first at 15°C., and second at room temperature for 2 hours in total, and then the excess allylamine was removed from the reaction mixture under reduced pressure to give a prepolymer.

SYNTHESIS 22

200 g. of polyethylene adipate diol having a number average molecular weight of about 2,000 were reacted with 32.8 g. of 1,6-hexamethylene dissocyanate in the presence of 0.5 g. of dibutyltin dilaurate at 90°C. for 3 hours with stirring under a nitrogen atmosphere to give an isocyanate-terminated polyethylene adipate.

Then to the resulting isocyanate-terminated polyethylene adipate there were added 100 g. of polypropylene glycol diol having a number average molecular weight of about 2,000 and the mixture was subjected to reaction at 90°C. for 3 hours with stirring under a nitrogen atmosphere to give an isocyanate-terminated polyester-polyether block polymer having a number average molecular weight of about 6450.

Then 645 g. of the resulting block polymer were reacted with 45 g. of methacrylic acid in the presence of 0.3 g. of hydroquinone at 100°C. for 6 hours to give a prepolymer.

EXAMPLE 1

Each of the prepolymers obtained in Synthesis 1 to 10, a variety of ethylenically unsaturated compounds set forth in Table 1 and 1 g. of benzoin were thoroughly mixed in a desired ratio set forth in Table 1 to give uniform photosensitive compositions. Then, a spacer of 1 mm. in thickness was inserted between two transparent glass sheets, each 10 mm. in thickness, and each of the resulting photosensitive composition was charged therebetween, respectively. One side of the transparent glass sheets was exposed for 10 minutes to a 270 W. super high pressure mercury lamp set at a distance of 15 cm. from the glass. Subsequently the two transparent glass sheets were removed. The mechanical properties of the photopolymerized articles were measured and the results are shown in Table 1. Run Nos. 12 to 17 are given for reference.

Conventional flexographic printing plates have a Shore hardness A of 35 to 75 and a suitable hardness is chosen depending on their applications. Generally, the mechanical strength of photopolymerized elastic articles tends to reduce when the hardness is decreased. Therefore the mechanical strength of different photopolymerized elastic articles should be compared in the terms of the same hardness. As is clear from Table 1, the tensile strength of prepolymers obtained by bonding a polyether diol to a polyester diol through a diisocyanate is much higher than that of prepolymers obtained by bonding a polyether diol to a polyether diol through a diisocyanate or bonding a polyester diol to a polyester diol through a diisocyanate (see Run Nos. 12 to 17).

Also when photopolymerized elastic articles are used as flexographic printing plates, the impact resilience becomes an important factor. When the impact resilience is 30 percent or less, such results in "fatigue of a printing plate" or "thickening of letters," which has been regarded as a fatal defect for practical purposes. As is clear from Table 1, the impact resilience of the photopolymerized articles of this invention is more than 30 percent while that of the photopolymerized articels obtained from prepolymer formed from polyether or polyester is less than 30 percent.

EXAMPLE 2

The procedure of Example 1 was repeated except that a variety of prepolymers set forth in Table 2 were employed and the results are shown in Table 2.

As stated in Example 1 conventional flexographic printing plates have Shore hardness A of 35 to 75 but they are required to have excellent strength and impact resilience at low hardness. The prepolymers comprising polyether-polyester block polymers according to this invention have these basic properties. It is clear from Table 2 that when dihydro-terminated ethylene oxidepropylene oxide copolymers are employed as polyether diols the photopolymerized articles obtained therefrom have superior tensile strength and impact resilience at such a low hardness as a Shore hardness A of around 40.

EXAMPLE 3

To 200 g. of the prepolymer in Synthesis 2, there were added 40 g. of 2hydroxyethyl methacrylate, 30 g. of n-butyl acrylate, 5 g. of acrylamide and 4.0 g. of benzoin ethyl ether and the mixture was thoroughly mixed to give a uniform photosensitive composition.

On a transparent glass sheet, 10 mm. in thickness, there was placed a negative film and the negative film was covered with a polyester film, 10 microns in thickness and a spacer, 3 mm, in thickness was placed thereon. Then, the resulting photosensitive composition was charged thereto and a transparent glass sheet, 10 mm, in thickness was placed on the spacer. Subsequently the resulting assembly was exposed to a 270 W. super high pressure mercury lamp set at a distance of 30 cm. from each of the glass sheets at room temperature, first from the upper glass sheet for 18 seconds, and second from the glass sheet of the negative side. Then the glass sheets, the negative film and the film covering the negative film were removed from the assembly and the unexposed portions of the photosensitive layer were washed out with a 2 percent sodium hydroxide solution and the resulting plate was dried in hot air. The relief images of the flexographic printing plate thus obtained had a height of 2.4 mm. and a Shore hardness A of 60 and the resolution of the plate was 0.1 mm. or more and the inking of the plate was also good.

The physical properties of the flexographic printing plate were as follows;

| Tensile strength | 135 Kg./cm². |
| 100 percent modulus | 54 Kg./cm². |
| Elongation | 480 % |
| Elongation set | 4 % |
| Impact resilience | 52 % |

Using the printing plate obtained by backing the resulting plate with a rubber sheet, 3 mm. in thickness a printing test was carried out with corrugated cardboards to give at least 500,000 clear and precise prints.

EXAMPLE 4

To 200 g. of the prepolymer in Synthesis 12, there were added 50 g. of 2-hydroxyethyl methacrylate, 10 g. of 2-ethylhexyl acrylate, 20 g. of n-butyl acrylate, 5 g. of acrylamide and 4.0 g. of benzoin ethyl ether and the mixture was thoroughly mixed to give a uniform photosensitive composition.

In the same manner as in Example 3 the photosensitive layer was exposed to actinic light and the unexposed portions of the photosensitive layer was washed out with a 2 percent aqueous surfactant solution (surfactant: trade mark "Lipon F" made by Lion Fat & Oil Co., Ltd.: Alkylbenzene sulfonic acid type surfactant) and the resulting plate was dried in hot air. The relief images of the flexographic printing plate thus obtained had a height of 2.3 mm. and a Shore hardness A of 43 and the resolution of the plate was 0.1 mm. or more and the inking of the plate was also good.

The physical properties of the flexographic printing plate was as follows;

| Tensile strength | 141 Kg./cm². |
| Tear strength | 59 Kg./cm². |
| 100 percent modulus | 19 Kg./cm². |
| Elongation | 510 % |
| Elongation set | 4 % |
| Impact resilience | 55 % |

Using the printing plate obtained by backing the resulting plate with a rubber sheet, 4 mm. in thickness a printing test was carried out with corrugated cardboards to give at least 500,000 clear and precise prints.

EXAMPLE 5

In the similar manner as in Synthesis 1 and 2 using polyethylene adipate diol having a number average molecular weight of about 1,000 polyethylene glycol diol having a number average molecular weight of about 1,000 and a mixture of 2,4-tolyene diisocyanate and 2,6-tolylene diisocyanate in a weight ratio of 80 to 20 there were obtained isocyanate-terminated polyesterpolyether block polymers having various weight ratio of the total weight polyester units to that of polyether units. Each of the resulting block polymers was reacted with 2-hydroxyethyl methacrylate in the similar manner as in Synthesis 2 to give prepolymers having two terminal ethylenic double bonds.

Figure 2:
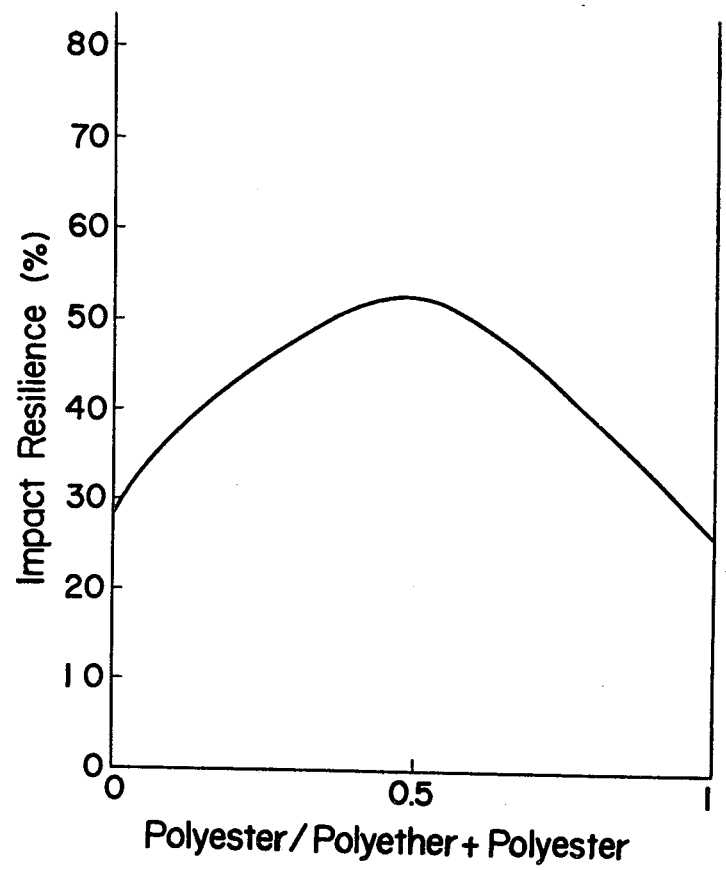

To 30 g. of each of the resulting prepolymers there were added 8 g. of 2-hydroxyethyl methacrylate, 5 g. of 2-ethylhexyl acrylamide, 2 g. of acrylamide and 1.0 g. of benzoin methyl ether, and the mixture was thorougly mixed to give uniform photosensitive compositions. Each of the resulting photosensitive compositions was photopolymerized in the same manner as in Example 1. The physical properties of the resulting photopolymerized articles are shown in FIGS. 1 and 2. As clearly understood from FIGS. 1 and 2, the tensile strength and impact resilience of the photopolymerized articles according to this invention are superior to those of the photopolymerized articles prepared from a prepolymer comprising a residue of polyester diol alone or a residue or polyether diol alone. Furthermore, the ratio of the weight of polyester units to that of polyether units in the prepolymer affects the strength and elastically and such an effect as it unexpected of any prepolymer comprising only a residue of polyester diol or only a residue of polyether diol can be obtained.

Then the same procedure as described above was repeated using a mixture of a prepolymer comprising the residue of polyether alone and a prepolymer comprising the residue of polyester along in a weight ratio of 1 : 1 and the results are as follows;

| Tensile strength | 85 Kg./cm². |
| Shore hardness A | 67 |
| Impact resilience | 25 % |

Thus the effect of a prepolymer comprising a polyether-polyester block according to this invention is not observed at all.

EXAMPLE 6

In the similar manner as in Synthesis 12 using polyethylene adipate diol having a number average molecular weight of about 2,000, dihydroxy-terminated ethylene oxide-propylene oxide block copolymer having 35 weight percent of ethylene oxide units and a number average molecular weight of about 2,000 and a mixture of 2,4-tolylene diisocyanate and 2,6-tolylene diisocyanate in a weight ratio of 80 to 20 there were obtained isocyanate-termination (polyester)-(ethylene oxide-propylene oxide copolymer) block polymers. Each of the resulting block polymers was reacted with 2-hydroxyethyl methacrylate in the similar manner as in Synthesis 12 to give prepolymers having two terminal ethylenic double bonds.

Figure 3:
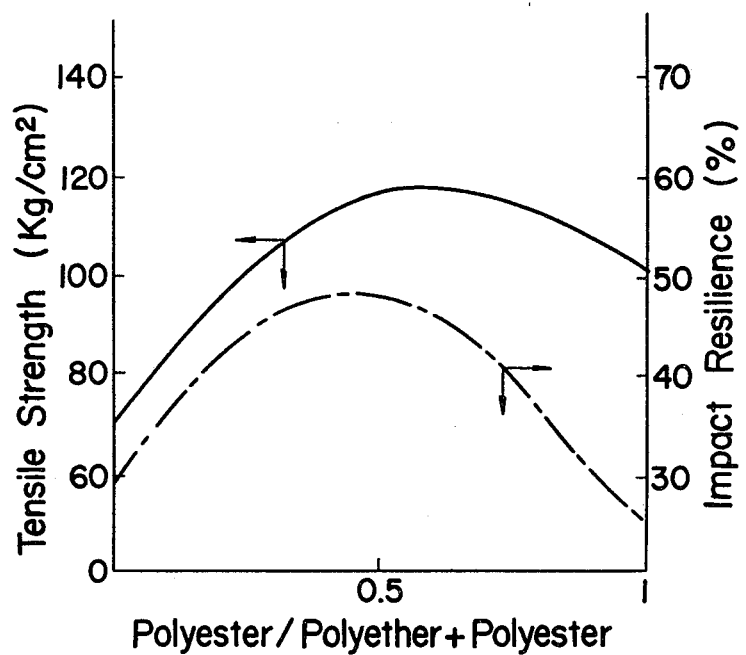
Figure 4:
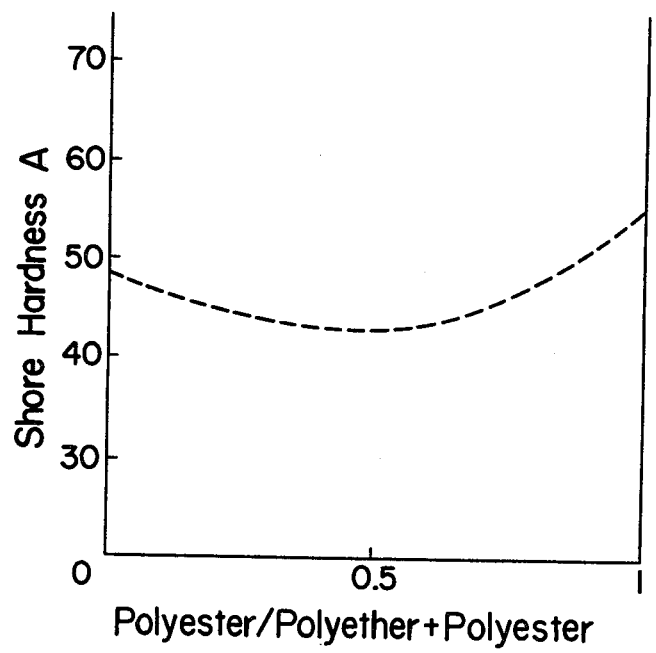

To 30 g. of each of the resulting prepolymers there were added 8 g. of 2-hydroxyethyl methacrylate, 5 g. of 2-ethylhexyl acrylamide, 2 g. of acrylamide and 1.0 g. of benzoin methyl ether, and the mixture was thoroughly mixed to give uniform photosensitive compositions, and each of the resulting photosensitive compositions was photopolymerized in the same manner as in Example 1. The physical properties of the resulting photopolymerized articles are shown in FIGS. 3 and 4. The similar effects as in Example 5 are observed.

Then the same procedure as described above was repeated using a mixture of a prepolymer comprising the residue of polyester diol alone and a prepolymer comprising the residue of dihydroxy-terminated ethylene oxidepropylene oxide copolymer alone in a weight ratio of 1 : 1 and the results are as follows;

| Tensile strength | 97 Kg./cm². |
| Shore hardness A | 56 |
| Impact resilience | 25 % |

Thus the effect of a prepolymer comprising the residue of (polyester)-(ethylene oxide-propylene oxide copolymer) block polymer according to this invention is not observed at all.

EXAMPLE 7

Printing durability and storage stability of the flexographic printing plates obtained in the similar manner as in Example 3 by using the same photosensitive compositions as in Example 5 were evaluated and the prepolymers and the results are shown in Table 3. Run Nos. 4 are given for comparison.

As is clear from Table 3, the flexographic printing plates according to this invention are superior in washing-out property and storage stability and may be used as sufficient printing plates.

In Run No. 5 even when on organic solvent such as acetone was used instead of the aqueous surfactant solution to remove unexposed areas, the washing-out property was poor and the resulting printing plate was swollen.

EXAMPLE 8

Preparation of Prepolymer A

The procedure of Synthesis 2 was repeated except that poly-ε-caprolactone diol having a number average molecular weight of about 2,000 was employed instead of the polyethylene adipate diol to give a prepolymer having a number average molecular weight of about 6,700.

Preparation of Prepolymer B 100 g. of polypropylene glycol diol having a number average molecular weight of about 2,000 were reacted with 210 g. of ε-caprolactone with stirring at 180°C. for 48 hours and then the reaction was continued under reduced pressure while removing volatile compounds to give a dihydroxyterminated polyether-polyester block polymer having a number average molecular weight of about 6,050. Then 60.5 g. of the resulting block polymer were reacted with 34.8 g. of a mixture of 2,4-tolylene diisocyanate and 2,6-tolylene diisocyanate in a weight ratio of 80 to 20 in the same manner as in Synthesis 2 to give an isocyanate-terminated block polymer and then the resulting isocyanate-terminated block polymer was reacted with 2-hydroxyethyl methacrylate in the same manner as in Synthesis 2 to give a prepolymer.

Preparation of Prepolymer C

The procedure of Synthesis 12 was repeated except that poly-ε-caprolactone diol having a number average molecular weight of about 3,000 was employed instead of the polyethylene adipate diol and dihydroxyterminated ethylene oxide-propylene oxide block copolymer having 25 weight percent of ethylene oxide units and a number average molecular weight of about 3,000 was employed instead of the ethylene oxide-propylene oxide copolymer to give a prepolymer having a number average molecular weight of about 9,800.

Preparation of Prepolymer D 150 g. of dihydroxy-terminated ethylene oxide-propylene oxide block copolymer having 25 weight percent of ethylene oxide units and a number average molecular weight of about 3,000 were reacted with 310 g. of ε-caprolactone with stirring at 180°C. for 48 hours and then the reaction was continued under pressure while removing volatile compounds to give a hydroxy-terminated polyether-polyester block polymer having a number average molecular weight of 8,950. Then 89.5 g. of the resulting block polymer were reacted with 34.8 g. of a mixture of 2,4-tolylene diisocyanate and 2,6-tolylene diisocyanate in a weight ratio of 80 to 20 in the same manner as in Synthesis 12 to give an isocyanate-terminated block polymer and then the resulting isocyanate-terminated block polymer was reacted with 2-hydroxyethyl methacrylate in the same manner as in Synthesis 12 to give a prepolymer.

Preparation of Photopolymerized articles 30 g. of each of Prepolymers A, B, C and D, 8 g. of 2-hydroxyethyl methacrylate, 4 g. of 2-ethylhexyl acrylate, 2 g. of methyl methacrylate and 1 g. of benzoin were thoroughly mixed to give uniform photosensitive compositions. Each of the resulting photosensitive compositions was photopolymerized in the same manner as in Example 1 and the physical properties of the resulting photopolymerized articles are shown in Table 4.

It is understood from Table 4 that a prepolymer is required to have urethane bonds between the residue of polyether and that of polyester.

EXAMPLE 9

Figure 5:
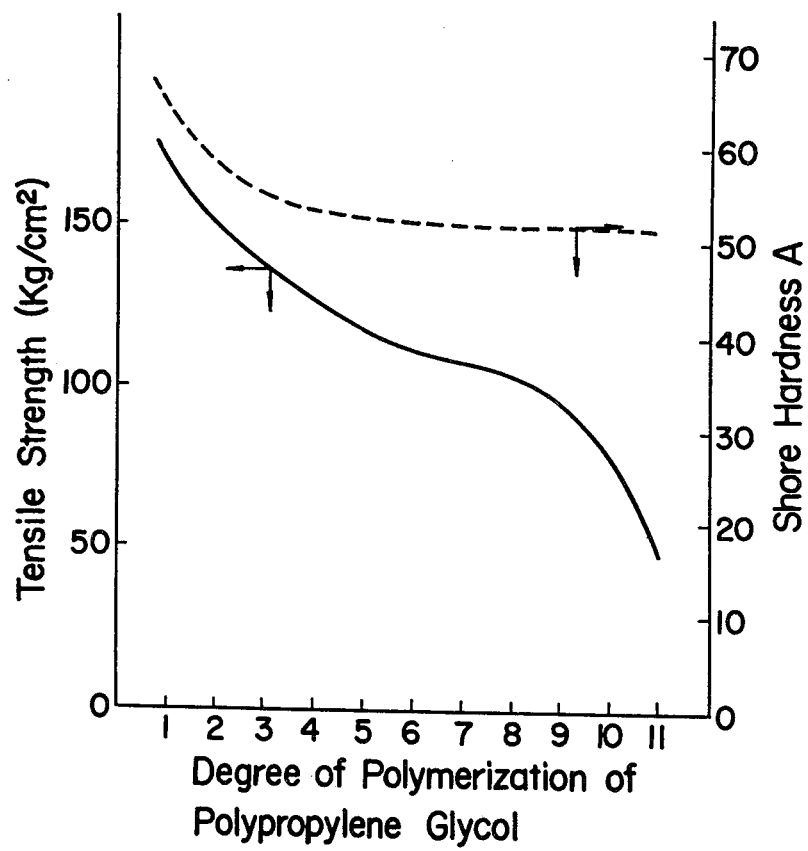
Figure 6:
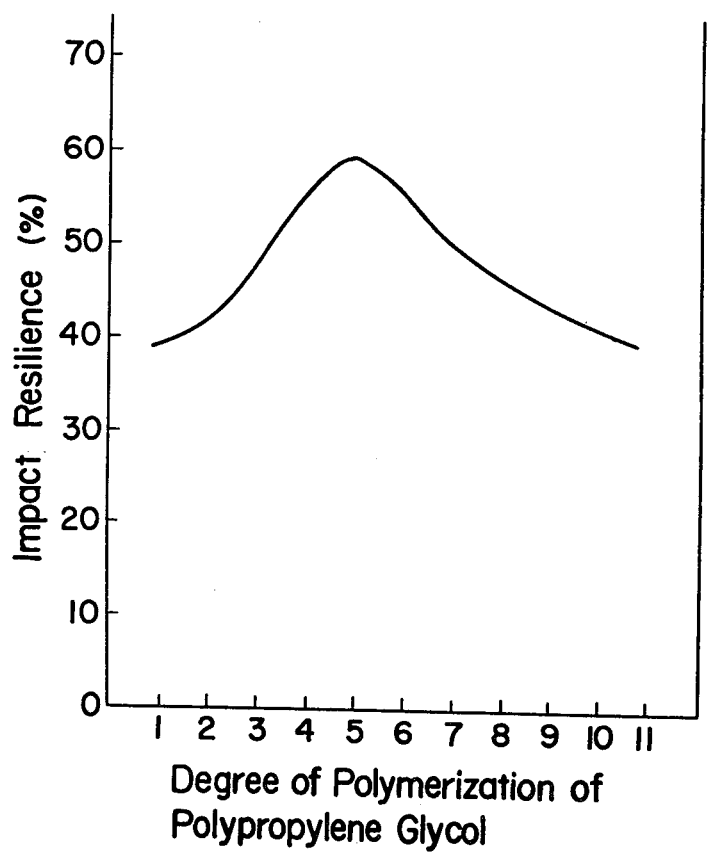

100 parts by weight of Prepolymer A in Example 8 were thoroughly mixed with 20 parts by weight of 2-hydroxypropyl methacrylate, 15 parts by weight of 2-ethylhexyl acrylate, 25 parts by weight of polypropylene glycol diol monoacrylates having various average degrees of polymerization of propylene glycol units and 1 part by weight of benzoin to give uniform photosensitive compositions. Each of the resulting photosensitive composition was photopolymerized in the same manner as in Example 1 to produce photopolymerized articles. The physical properties of the articles are shown in FIGS. 5 and 6.

It is understood that when the polypropylene glycol diols have degrees of polymerization of 4 to 6, most preferred flexographic printing plate may be produced.

EXAMPLE 10

In the same manner as in Synthesis 2 there were prepared a variety of prepolymers using polyether diols and polyester diols set forth in Table 5 at the same mole ratio as in Synthesis 2.

To 30 g. of each of the resulting prepolymers there were added 7 g. of n-butyl acrylamide, 5 g. of 2hydroxyethyl acrylate, 1 g. of acrylamide and 0.8 g. of benzoin, and the mixture was thoroughly mixed to give uniform photosensitive compositions. Each of the resulting photosensitive compositions was photopolymerized in the same manner as in Example 1. The physical properties of the photopolymerized articles are shown in Table 5. Run Nos. 7 to 9 are given for comparison.

EXAMPLE 11

In the same manner as in Synthesis 2, 3 or 12 there were prepared various prepolymers set forth in Table 6. Run Nos. 6 to 8 in Table 6 are given for comparison. To 100 parts by weight of each of the resulting prepolymers there were added 15 parts by weight of 2-hydroxyethyl methacrylate, 15 parts by weight of 2-ethylhexyl acrylate, 5 parts of acrylamide, 10 parts by weight of polypropylene glycol monomethacrylate having a number average molecular weight of about 400 and 2 by weight of benzoin and the mixture was thoroughly mixed to give uniform photosensitive compositions. Each of the resulting photosensitive compositions was photopolymerized in the same manner as in Example 3 to give flexographic printing plates and the washing-out property, resistance to water, printing durability and storage stability of the resulting plates are set forth in Table 7. Run Nos. 6 to 8 are given for comparison.

As is clear from Tables 6 and 7, when ethylene oxide-propylene oxide copolymers are employed as the polyether diols the above-described properties are further remarkably improved.

In Run No. 6 even when an organic solvent such as acetone was used instead of the aqueous surfactant solution to remove unexposed areas, the washing-out property was poor and the resulting printing plate was swollen.

EXAMPLE 12

Run Nos. 1 to 5 in Example 11 were repeated and the net time required for preparing flexographic printing plate at 25°C. and 0°C., i.e., the total period of time of irration of actinic light to the photosensitive compositions, washing-out unexposed areas and drying the resulting printing plates, and the Shore hardness A of the printing plates immediately after preparation and after 6 months are shown in Table 8.

It is understood from Table 8 that when ethylene oxide-propylene oxide block copolymers are employed as the polyether the processability of printing plates is much more improved and the change in hardness is hardly observed, especially with the use of a polypropylene adipate as the polyester.

EXAMPLE 13

300 g. of the same isocyanate-terminated polyester-polyether block polymer having a number average molecular weight of about 6,500 as in Synthesis 2 were reacted with a variety of terminally vinylating compounds set forth in Table 9 in such an amount as to substantially complete the reaction between the terminal isocyanates and the vinylating compound in the presence of 0.1 g. of hydroquinone at 70°C. for 4 hours with stirring to give prepolymers.

Each of the resulting prepolymers, a variety of ethylenically unsaturated compounds set forth in Table 9 and 1 g. of benzoin were thoroughly mixed in a desired ratio set forth in Table 9 to give uniform photosensitive compositions. Each of the resulting photosensitive compositions was photopolymerized in the same manner as in Example 1 to give photopolymerized articles. The physical properties of the articles are shown in Table 9. It is clear from Table 9 that when terminally vinylating agents of the formula

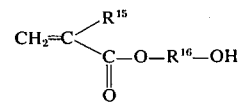

wherein
R$^{15}$ represents a hydrogen atom or methyl group;
R$^{16}$ represents an oxyalkylene group of

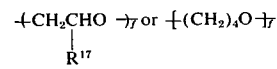

wherein
R$^{17}$ represents a hydrogen atom or methyl, monochloromethyl or monobromomethyl group;
$f$ represents an integer of 2 to 20, are used the resulting flexographic printing plates have excellent impact resilience at low hardness and that when an ethylenically unsaturated compound having a polyoxyalkylene chain is used, the impact resilience is further improved.

Then in the same manner as in Example 3 flexographic printing plates weere prepared by using each of the same photosensitive compositions as in Run Nos. 1 to 14 and 17 and 18. Using these printing plates corrugated cardboards were clearly and precisely printed.

EXAMPLE 14

In the same manner as in Synthesis 2 there was prepared a prepolymer by using two moles of polyethylene adiphate diol having a number average molecular weight of about 800, one mole of polyethylene glycol diol having a number average molecular weight of about 800, four moles of diphenylmethane-4,4-diisocyanate and further 2.5 moles of 2-hydroxyethyl methacrylate in the same order as in Synthesis 2. The resulting prepolymer was a polyesterpolyether-polyester type block polymer.

30 g. of the resulting prepolymer were thoroughly mixed with 10 g. of 2-hydroxyethyl methacrylate, 2 g. of acrylamide, 1 g. of n-butyl acrylamide and 0.8 g. of benzoin methyl ether to give a uniform photosensitive composition. The resulting photosensitive composition was photo-polymerized in the same manner as in Example 1 to give a photopolymerized article.

The physical properties are shown as follows;

| | |
|---|---|
| Tensile strength | 207 Kg./cm$^2$. |
| Elongation | 170 % |
| Shore hardness A | 92 |
| Permanent set after 10 | | minutes' elongation for
100 percent         9 %

A printing plate was prepared in the same manner as in Example 3 by using the same photosensitive composition as described above. The plate had a relief height of 0.53 mm. and the resolution of the plate was 100 lines per inch. A rotary printing for newspaper was run using this printing plate to give 1,000,000 clear and precise prints and any deformation and damage of the relief image was not observed.

EXAMPLE 15

Each of the prepolymers obtained in Syntheses 14 to 17, a variety of ethylenically unsaturated compounds set forth in Table 10 and 1 g. of benzoin were thoroughly mixed in a desired ratio set forth in Table 10 to give uniform photosensitive compositions. Each of the resulting photosensitive compositions was photopolymerized in the same manner as in Example 1 to give photopolymerized articles. The physical properties of the articles are shown in Table 10. Run Nos. 5 to 8 are given for comparison.

The photopolymerized articles in Run Nos. 7 and 8 after left to stand in atmosphere for two weeks were remarkably increased in hygroscopicity.

EXAMPLE 16

A printing plate for newspaper was produced by using 200 g. of the photosensitive composition of Run No. 4 in Example 15 except that 3.0 g. of benzoin methyl ether was employed instead of the benzoin.

On a transparent glass sheet, 10 mm. in thickness, there was placed a 390 mm. × 550 mm. negative film for newspaper. Then the negative film was covered with a polyester film, 10 microns in thickness and a spacer, 0.7 mm in thickness, was placed thereon and the photosensitive composition was charged thereto. Then a polyester film, 120 microns in thickness, was laminated to the layer of the photosensitive composition, and a transparent glass sheet, 5 mm. in thickness, was placed thereupon. Fist, the outside of the upper glass sheet was exposed for 5 seconds to 15 ultra violet fluorescent lamps, each 20W, set at a distance of 15 cm. from the glass, and second from the glass sheet of the negative film side for 25 seconds to a 3 KW super high pressure mercury lamp set at a distance of 40 cm. After exposure the two glass sheets and the polyester film covering the negative film were removed and the photopolymerized layer on the polyester base film was washed for about one minute by spraying a 2 % aqueous surfactant solution ("Lipon F" trade mark; alkylbenzene sulfonic acid type, made by Lion Fat & Oil Co., Ltd.) thereto and dried for 3 minutes, and the whole plate was postexposed for 3 minutes to the same ultra violet fluorescent lamps to produce a printing plate for newspaper having a reflief height of 0.55 mm. The resolution of this plate was 120 lines per inch and the inking was good and there was no lowering in the physical propertes due to absorption of moisture. A rotary printing for newspaper was run using this printing plate to give 1 million clear and precise prints and any deformation and damage of the relief image was not observed.

The above-described procedure was repeated using 200 g. of each of the photosensitive compositions of Run Nos. 6 and 8 in Example 15.

Regarding the photosensitive composition of Run No. 6, the washing-out property was insufficient and the resolution of the plate was as low as 30 lines per inch and furthermore the prints obtained were lacking in precision of letters.

Regarding the photosensitive compositions of Run No. 8, the resolution of the plate was 120 lines per inch but the physical properties were remarkably poor and the printing durability was at most 10,000 prints. Furthermore, the storage stability was very low due to hygroscopicity.

The photosensitive composition of this invention was very low in viscosity such as about 50 to 100 poise and the foam mixed therein could readily be removed and the handling was very easy. The washing-out property was excellent with low viscosities of photosensitive compositions.

EXAMPLE 17

The change of photosensitivity with a lapse of time was measured with the photosenitive compositions of Example 1, Run No. 4 and Example 15, No. 4 additionally containing 0.1 g. of each of the compounds set forth in Table 11. The results are shown in Table 11.

Then using the each of the above-described photosensitive compositions a printing plate was prepared in the same manner as in Example 3. The inking of the resulting printing plates obtained from the photosensitive compositions of Example 15, No. 4 was excellent in spite of their relatively high hardness.

EXAMPLE 18

Each of the prepolymers obtained in Syntheses 18 and 19, a variety of ethylenically unsaturated compounds set forth in Table 12 and 1 g. of benzoin were thoroughly mixed in a desired ratio set forth in Table 12 to give uniform photosensitive compositions. Each of the resulting photosensitive compositions was photopolymerized in the same manner as in Example 1. The physical properties of the photopolymerized articles are shown in Table 12.

EXAMPLE 19

In the same manner as in Synthesis 2 there were prepared a variety of prepolymers using polyethediols and polyesterdiols set forth in Table 13 in the same mole ratio as in Synthesys 2.

To 100 g. of each of the resulting prepolymers there were added 20 g. of 2-hydroxypropyl methacrylate, 5 g. of 2-hydroxyethyl methacrylate, 5 g. of acrylamide, 5 g. of n-butyl acrylate and 2 g. of benzoin methyl ether, and the mixture was thoroughly mixed to give a uniform photosensitive composition. Each of the resulting photosensitive compositions was photopolymerized in the same manner as in Example 1. The physical properties of the photopolymerized articles are shown in Table 13.

EXAMPLE 20

Preparation of prepolymers 200 g. of polypropylene adipate diol having a number average molecular weight of about 2,000 were reacted with 0.2 mole of each of the diisocyanates set forth in Table in the presence of 0.5 g. of dibutyltin dilaurate to give isocyanate-terminated polyproplene adipates (first reaction). Then the resulting polypropylene adipates were further reacted with 100 g. of polyproplene glycol doil having a number average molecular weight of about 2,000 to give an isocyanate-terminated polyester-polyether block polymer (second reaction). Then 300 g. of the resulting polyester-polyether block polymer were reacted with 25 g. of 2-hydroxyethyl methacrylate in the presence of 0.1 g. of hydroquinone to give a prepolymer (third reaction). The first and second reactions were carried out in a nitrogen atmosphere with stirring under the conditions set forth in Table 14, and the third reaction was carried out with stirring under the conditions set forth in Table 14.

Preparation of photopolymerized articles

To 100 g. of each of the resulting prepolymers there were added 20 g. of 2-hydroxyethyl methacrylate, 5 g. of styrene, 5 g. of n-butyl acrylate, 5 g. of acrylamide and 2 g. of benzoin, and the mixture was thoroughly mixed to give uniform photosensitive compositions. Each of the resulting photosensitive compositions was photopolymerized in the same manner as in Example 1. The physical properties of the photopolymerized articles are shown in Table 14.

EXAMPLE 21

30 g. of each of the prepolymers obtained in Synthesis 20, 4 g. of a variety of ethylenically unsaturated compounds set forth in Table 15, 2 g. of methyl methacrylate, 3 g. of n-butyl acrylate, 4 g. of 2-hydroxyethyl methacrylate and 1 g. of benzoin were thoroughly mixed in a desired amount set forth in Table 15 to give uniform photosensitive compositions. Each of the photosensitive compositions was photopolymerized in the same manner as in Example 1 and the physical properties of the resulting photopolymerized articles are shown in Table 15.

EXAMPLE 22

Each of the prepolymers obtained in Syntheses 21 and 22, a variety of ethylenically unsaturated compounds set forth in Table 16 and 1 g. of benzoin were thoroughly mixed in a desired ratio set forth in Table 16 to give uniform photosensitive compositions. Each of the photosensitive compositions was photopolymerized in the same manner as in Example 1 and the physical properties of the resulting photopolymerized articles are shown in Table 16.

Table 1

| Run No. | Prepolymer | (g.) | St (g.) | Ethylenically Unsaturated compound* MMA (g.) | HEMA (g.) | AAm (g.) | nBa (g.) | Properties of photopolymerized article Shore hardness A | Tensile strength (Kg./cm$^2$.) | Impact resilience (%) |
|---|---|---|---|---|---|---|---|---|---|---|
| 1 | Synthesis 1 | 30 | — | — | — | — | — | 51 | 105 | 34 |
| 2 | Synthesis 1 | 30 | — | 4 | 4 | 2 | 4 | 57 | 113 | 48 |
| 3 | Synthesis 2 | 30 | 5 | — | 4 | — | 4 | 68 | 139 | 39 |
| 4 | Synthesis 2 | 30 | — | 4 | 4 | 2 | 4 | 57 | 126 | 45 |
| 5 | Synthesis 2 | 30 | — | 2** | 5 | 2 | — | 87 | 176 | 30 |
| 6 | Synthesis 7 | 30 | — | 4 | 4 | 2 | 4 | 51 | 124 | 37 |
| 7 | Synthesis 8 | 30 | — | 4 | 4 | 2 | 4 | 58 | 114 | 34 |
| 8 | Synthesis 9 | 30 | — | 4 | 4 | 2 | 4 | 53 | 108 | 32 |
| 9 | Synthesis 10 | 30 | 2 | 1 | 5 | — | 4 | 52 | 135 | 38 |
| 10 | Synthesis 10 | 30 | 0 | 3 | 5 | 2 | 4 | 55 | 140 | 41 |
| 11 | Synthesis 10 | 30 | 0 | 3 | 4 | 3 | 4 | 53 | 129 | 47 |
| 12 | Synthesis 3 | 30 | — | 4 | 4 | 2 | 4 | 62 | 85 | 28 |
| 13 | Synthesis 3 | 30 | 5 | — | 4 | — | 4 | 68 | 89 | 24 |
| 14 | Synthesis 4 | 30 | — | 4 | 4 | 2 | 4 | 53 | 64 | 26 |
| 15 | Synthesis 5 | 30 | — | 5 | 5 | — | 5 | 73 | 101 | 21 |
| 16 | Synthesis 6 | 30 | 5 | — | 4 | — | 4 | 59 | 55 | 26 |
| 17 | Synthesis 3 Synthesis 4 | 15 | — | 4 | 4 | 2 | 4 | 58 | 72 | 27 |

*St: styrene, MMA: methyl methacrylate, nBA: n-butyl acrylate,
HEMA: 2-hydroxyethyl methacrylate, AAm: acrylamide
**N,N'-methylenebisacrylamide Table 2

| Run No. | Prepolymer | (g.) | St (g.) | Ethylenically unsaturated compound* MMA (g.) | HEMA (g.) | AAm (g.) | nBA (g.) | Properties of photopolymerized article Shore hardness A | Tensile strength (Kg./cm$^2$.) | Impact resilience (%) |
|---|---|---|---|---|---|---|---|---|---|---|
| 1 | Synthesis 11 | 30 | — | — | — | — | — | 40 | 107 | 33 |
| 2 | Synthesis 11 | 30 | — | 3 | 4 | 1 | 4 | 43 | 124 | 45 |
| 3 | Synthesis 12 | 30 | 3 | — | 5 | — | 5 | 45 | 139 | 36 |
| 4 | Synthesis 12 | 30 | — | 3 | 4 | 1 | 4 | 40 | 125 | 48 |
| 5 | Synthesis 12 | 30 | — | 2 | 8** | 1 | 2 | 38 | 158 | 59 |
| 6 | Synthesis 13 | 30 | — | 3 | 4 | 1 | 4 | 40 | 130 | 44 |
| 7 | Synthesis 13 | 30 | — | 2 | 8** | 1 | 2 | 37 | 161 | 57 |
| 8 | Synthesis 3 | 30 | 3 | — | 5 | — | 5 | 69 | 109 | 22 |
| 9 | Synthesis 3 | 30 | — | 3 | 4 | 1 | 4 | 58 | 95 | 21 |
| 10 | Synthesis 4 | 30 | — | 3 | 4 | 1 | 4 | 53 | 68 | 28 |
| 11 | Synthesis 5 | 30 | 3 | — | 5 | — | 5 | 65 | 103 | 24 |
| 12 | Synthesis 6 | 30 | 3 | — | 5 | — | 5 | 54 | 73 | 27 |
| 13 | Synthesis 3 Synthesis 4 | 15 15 | — | 3 | 4 | 1 | 4 | 62 | 89 | 26 |

*St: styrene, MAA: methyl methacrylate, nBA: n-butyl acrylate, HEMA: 2-hydroxyethyl methacrylate, AAm: acrylamide
**polypropylene glycol monomethacrylate having a number average molecular weight of about 400

Table 3

| Run No. | Weight ratio of total weight of polyether diol residue to that of polyester diol residue | Washing-out property* | Storage stability** (%) | Printing durability on corrugated cardboard (number of prints) | Note |
|---|---|---|---|---|---|
| 1 | 2 | I | − 5.3 | 500,000 | |
| 2 | 0.6 | I | − 1.1 | 500,000 | |
| 3 | 0.5 | I | − 2.4 | 500,000 | |
| 4 | polyether diol alone | II | − 41.0 | at 10,000 prints "fatigue" took place | plate was remarkably hygroscopic |
| 5 | polyester diol alone | III | − 13.1 | — | |

*I: Resolution = at least 100 lines per inch (10 to 90 % in reproduction) LL6  II: Resolution = 80 lines per inch (10 to 90 % in reproduction)

III: It was impossible to washing-out unexposed areas and accordingly a flexgraphic printing plate could not be produced.
Washing-out solution = 2% aqueous surfactant solution ("Lipon F" trade mark: alkylbenzene sulfonic acid type, made by Lion Fat & Oil Co., Ltd.)
**Reduction in tensile strength after leaving the photopolymerized articles to stand in atmosphere for one month.

Table 4

| Prepolymer | Tensile strength (Kg./cm$^2$.) | Elongation (%) | Elongation set (%) | Impact resilience (%) | Storage stability* (%) |
|---|---|---|---|---|---|
| A | 143 | 540 | 5 | 61 | − 2.3 |
| B | 97 | 513 | 14 | 49 | − 7.1 |
| C | 145 | 570 | 6 | 59 | − 2.7 |
| D | 118 | 530 | 12 | 47 | − 7.3 |

*Reduction in tensile strength after leaving the photopolymerized articles to stand in atmosphere for one month.

Table 5

| Run No. | Prepolymer Polyether diol | Prepolymer Polyester diol | Tensile strength (Kg./cm$^2$.) | Shore hardness A | Impact resilience (%) | Elongation set (%) |
|---|---|---|---|---|---|---|
| 1 | Polyethylene glycol diol $\overline{M}n$: about 1,000 | Polyethylene adipate diol $\overline{M}n$: about 1,000 | 128 | 58 | 48 | 5 |
| 2 | Polypropylene glycol diol $\overline{M}n$: about 1,000 | Poly-ε-caprolactone diol $\overline{M}n$: about 2,000 | 121 | 57 | 46 | 7 |
| 3 | Polypropylene glycol diol $\overline{M}n$: about 2,000 | Polyethylene adipate diol $\overline{M}n$: about 2,000 | 131 | 55 | 51 | 4 |
| 4 | Polypropylene glycol diol $\overline{M}n$: about 600 | Polyethylene adipate diol $\overline{M}n$: about 1,000 | 117 | 57 | 45 | 7 |
| 5 | Polypropylene glycol diol $\overline{M}n$: about 450 | Polyethylene adipate diol $\overline{M}n$: about 1,000 | 94 | 69 | 31 | 13 |
| 6 | Polypropylene glycol diol $\overline{M}n$: about 1,000 | Polyethylene adipate diol $\overline{M}n$: about 450 | 103 | 71 | 30 | 15 |
| 7 | Polyethylene glycol diol $\overline{M}n$: about 400 | Poly-ε-caprolactone diol $\overline{M}n$: about 2,000 | 89 | 71 | 25 | 24 |
| 8 | Polypropylene glycol diol $\overline{M}n$: about 3,000 | Polyethylene adipate diol $\overline{M}n$: about 800 | 97 | 59 | 22 | 28 |
| 9 | Polypropylene glycol diol $\overline{M}n$: about 6,000 | Polyethylene adipate diol $\overline{M}n$: about 3,000 | 45 | 58 | 24 | 23 |

$\overline{M}n$: number average molecular weight

Table 6

| Run No. | Prepolymer Polyether diol | Polyester diol | Soft segments in prepolymer |
|---|---|---|---|
| 1 | Dihydroxy-terminated ethylene oxide-propylene oxide block copolymer having 30 weight percent of ethylene oxide units and a $\overline{M}n$ of 2,000 | Polyethylene adipate diol having a $\overline{M}n$ of about 2,000 | Polyether-Polyester-Polyether |
| 2 | Dihydroxy-terminated ethylene oxide-propylene oxide block copolymer having 35 weight percent of ethylene oxide units and a $\overline{M}n$ of about 3,000 | Polypropylene adipate diol having a $\overline{M}n$ of about 2,000 | Polyester-Polyether-Polyester |
| 3 | Dihydroxy-terminated ethylene oxide-propylene oxide random copolymer having 40 weight percent of ethylene oxide units and a $\overline{M}n$ of about 2,000 | Polypropylene adipate diol having a $\overline{M}n$ of about 2,000 | Polyester-Polyether-Polyester |
| 4 | Propylene glycol diol having a $\overline{M}n$ of about 2,000 | Polyethylene adipate diol having a $\overline{M}n$ of about 2,000 | Polyester-Polyether-Polyester |
| 5 | Polyethylene glycol diol having a $\overline{M}n$ of about 2,000 | Polyethylene adipate diol having a $\overline{M}n$ of about 2,000 | Polyester-Polyether-Polyester |
| 6 | Propylene glycol diol havng a $\overline{M}n$ of about 2,000 | — | Polyether alone |
| 7 | — | Polyethylene adipate diol having a $\overline{M}n$ of about 2,000 | Polyester alone |
| 8 | Dihydroxy-terminated ethylene oxide-propylene oxide block copolymer having 40 | — | Polyether alone |

Table 6-continued

| Run No. | Polyether diol | Prepolymer Polyester diol | Soft segments in prepolymer |
|---|---|---|---|
| | weight percent of ethylene oxide units and a Mn of about 2,000 | | |

Mn: number average molecular weight

Table 7

| Run No. | Time required for completing washing-out* (minute) | Resistance to water of photopolymerized article** (%) | Printing durability on corrugated cardboard (number of prints) |
|---|---|---|---|
| 1 | 4 | 5.3 | 700,000 |
| 2 | 3 | 4.1 | 700,000 |
| 3 | 5 | 6.0 | 700,000 |
| 4 | 15 | 9.7 | 500,000 |
| 5 | 8 | 18.2 | 500,000 |
| 6 | 17 | 23.6 | Printing plate was remarkably hygroscopic and at 10,000 prints "fatigue" took place. |
| 7 | It was impossible to completely wash-out unexposed portions and accordng a flexograhic printing plate could not be obtained. | | |
| 8 | 4 | 28.4 | Printing plate was remarkably hygroscopic and at 10,000 prints "fatigue" took place. |

*Time required for obtaining a resolution of 100 lines per inch (10 to 90 percent in reproduction) or more by constantly spraying a 3% aqueous surfactant solution ("Lipon F" trade mark: alkylbenzene sulfonic acid type, made by Lion Fat & Oil Co., Ltd.) to a photopolymerized plate.
**Increase in weight (%) after immersing the photopolymerized plates in water at 20°C. for one week.

Table 8

| Run No. | Prepolymer in Example 11 | Net time required for preparing a flexographic printing plate at 25°C. (minute) | Net time Required for preparing a flexographic printing plate at 0°C. (minute) | Shore hardness A of a flexographic printing plate immediately after preparation | Shore hardness A of a flexographic printing plate after 6 months | Difference in shore hardness A |
|---|---|---|---|---|---|---|
| 1 | Run No. 1 | 6 | 15 | 42 | 43 | +1 |
| 2 | Run No. 2 | 5 | 8 | 40 | 40 | 0 |
| 3 | Run No. 3 | 6 | 8 | 41 | 40 | 0 |
| 4 | Run No. 4 | 15 | 30 | 52 | 56 | +4 |
| 5 | Run No. 5 | 17 | 30 | 58 | 63 | +5 |

Table 9

| Run No. | Terminally vinylating compound* | Prepolymer (g.) | St (g.) | MMA (g.) | HEMA (g.) | AAm (g.) | nBA (g.) | Shore hardness A | Tensile strength (Kg./cm².) | Impact resilience (%) |
|---|---|---|---|---|---|---|---|---|---|---|
| 1 | PEGMA (n = 2) | 30 | — | 4 | 4 | 2 | 4 | 43 | 123 | 54 |
| 2 | " | 30 | 2 | — | 5 | 1 | 5 | 45 | 119 | 51 |
| 3 | PEGMA (n = 7) | 30 | — | — | — | — | — | 40 | 103 | 59 |
| 4 | " | 30 | — | 4 | 4 | 2 | 4 | 38 | 97 | 61 |
| 5 | " | 30 | 2 | — | 5 | 1 | 5 | 42 | 114 | 58 |
| 6 | PEGMA (n = 15) | 30 | — | 4 | 4 | 2 | 4 | 39 | 109 | 57 |
| 7 | " | 30 | 2 | — | 5 | 1 | 5 | 42 | 106 | 55 |
| 8 | PPGMA (n = 2) | 30 | — | 4 | 4 | 2 | 4 | 45 | 117 | 53 |
| 9 | " | 30 | 2 | — | 5 | 1 | 5 | 44 | 125 | 50 |
| 10 | PPGMA (n = 7) | 30 | — | 4 | 4 | 2 | 4 | 41 | 117 | 55 |
| 11 | " | 30 | 2 | — | 5 | 1 | 5 | 40 | 109 | 52 |
| 12 | " | 30 | 2 | — | 5*** | 1 | 5 | 38 | 122 | 68 |
| 13 | PPGMA (n = 20) | 30 | — | 4 | 4 | 2 | 4 | 40 | 104 | 53 |
| 14 | " | 30 | 2 | — | 5 | 1 | 5 | 41 | 107 | 54 |
| 15 | PEGMA (n = 24) | 30 | — | 4 | 4 | 2 | 4 | 41 | 77 | 48 |
| 16 | " | 30 | 2 | — | 5 | 1 | 5 | 39 | 81 | 49 |
| 17 | CLMA (n = 7) | 30 | — | 4 | 4 | 2 | 4 | 38 | 108 | 58 |
| 18 | " | 30 | 2 | — | 5 | 1 | 5 | 40 | 112 | 53 |
| 19 | HEMA | 30 | — | 4 | 4 | 2 | 4 | 57 | 126 | 45 |
| 20 | " | 30 | 2 | — | 5 | 1 | 5 | 55 | 119 | 47 |

*PEGMA (n = 2): polyethylene glycol monomethacrylate having an average degree of polymerization of 2
PEGMA (n = 7): polyethylene glycol monomethacrylate having an average degree of polymerization of 7
PEGMA (n = 15): polyethylene glycol monomethacrylate having an average degree of polymerization of 15

Table 9-continued

| Run No. | Terminally vinylating compound* | Prepolymer (g.) | St (g.) | Ethylenically unsaturated compound** | | | | Properties of photopolymerized product | | |
|---|---|---|---|---|---|---|---|---|---|---|
| | | | | MMA (g.) | HEMA (g.) | AAm (g.) | nBA (g.) | Shore hardness A | Tensile strength (Kg./cm².) | Impact resilience (%) |

PPGMA (n = 2): polypropylene glycol monomethacrylate having an average degree of polymerization of 2
PPGMA (n = 7): polypropylene glycol monomethacrylate having an average degree of polymerization of 7
PPGMA (N = 20): polypropylene glycol monomethacrylate having an average degree of polymerization of 20
PEGMA (n = 24): polyethylene glycol monomethacrylate having an average degree of polymerization of 24

HEMA: 2-hydroxyethyl methacrylate, CLMA:

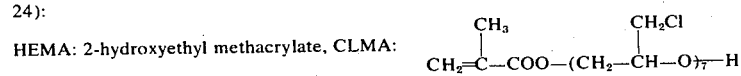

$$CH_2=C(CH_3)-COO-(CH_2-CH(CH_2Cl)-O)_7-H$$

**St: styrene MMA: methyl methacrylate, nBA: n-butyl acrylate,
HEMA: 2-hydroxyethyl methacrylate, AAm: acrylamide
***polypropylene glycol monomethacrylate having a number average molecular weight of about 400

Table 10

| Run No. | Prepolymer | (g.) | Ethylenically unsaturated compound* | | | | Properties of photopolymerized product | | |
|---|---|---|---|---|---|---|---|---|---|
| | | | MMA (g.) | HEMA (g.) | AAm (g.) | TEGDMA (g.) | Shore hardness D | Tensile strength (Kg./cm².) | Permanent set** (%) |
| 1 | Synthesis 14 | 30 | 5 | 8 | 2 | — | 35 | 192 | 7 |
| 2 | Synthesis 14 | 30 | 4 | 5 | 2 | 2 | 37 | 187 | 7 |
| 3 | Synthesis 15 | 30 | 5 | 8 | 2 | — | 38 | 223 | 6 |
| 4 | Synthesis 15 | 30 | 4 | 5 | 2 | 2 | 42 | 219 | 8 |
| 5 | Synthesis 16 | 30 | 5 | 8 | 2 | — | 43 | 145 | 17 |
| 6 | Synthesis 16 | 30 | 4 | 5 | 2 | 2 | 45 | 139 | 15 |
| 7 | Synthesis 17 | 30 | 5 | 8 | 2 | — | 34 | 120 | 12 |
| 8 | Synthesis 17 | 30 | 4 | 5 | 2 | 2 | 39 | 141 | 13 |

*MMA : methyl methacrylate, AAm : acrylamide
HEMA : 2-hydroxyethyl methacrylate, TEGDMA : tetraethyleneglycol dimethacrylate
**permanent set after 10 minutes' elongation for 100 percent Table 11

| Run No. | Photosensitive composition (200 g.) | Ethylenically unsaturated compound (0.1 g.) | 1 day after preparation (mm.)* | 20 days after preparation (mm.)* | 60 days after preparation (mm.)* |
|---|---|---|---|---|---|
| 1 | Example 1, Run No. 4 | 2-Acid phosphoxy-ethyl methacrylate | 0.44 | 0.42 | 0.41 |
| 2 | " | 3-Chloro-2-acid phosphoxypropyl methacrylate | 0.45 | 0.43 | 0.41 |
| 3 | " | 2-Acid phosphoxyethyl acrylate | 0.44 | 0.43 | 0.40 |
| 4 | " | — | 0.35 | 0.30 | 0.26 |
| 5 | Example 15, Run No. 4 | 2-Acid phosphoxyethyl methacrylate | 0.42 | 0.40 | 0.38 |
| 6 | " | 3-Chloro-2-acid phosphoxypropyl methacrylate | 0.42 | 0.40 | 0.39 |
| 7 | " | 2-Acid phosphoxyethyl acrylate | 0.44 | 0.42 | 0.41 |
| 8 | " | — | 0.37 | 0.34 | 0.29 |

*Thickness of hardened layer of the photosensitive compositions with the lapse of time when photosensitive compositions were irradiated at 750 lx. for 2 minutes.

Table 12

| Run No. | Prepolymer | St (g.) | Ethylenically unsaturated compound* | | | | Properties of photopolymerized article | | |
|---|---|---|---|---|---|---|---|---|---|
| | | | MMA (g.) | HEMA (g.) | AAm (g.) | nBA (g.) | Shore hardness A | Tensile strength (Kg./cm².) | Impact resilience (%) |
| 1 | Synthesis 18 | 30 | — | 4 | 4 | 2 | 4 | 65 | 119 | 43 |
| 2 | Synthesis 18 | 30 | 2 | 2 | 4 | 1 | 4 | 68 | 125 | 38 |
| 3 | Synthesis 19 | 30 | — | 4 | 4 | 2 | 4 | 63 | 120 | 42 |
| 4 | Synthesis 19 | 30 | 2 | 2 | 4 | 1 | 4 | 66 | 122 | 40 |

*St : styrene, MAA: methyl methacrylate, nBA: n-butyl acrylate, HEMA: 2-hydroxyethyl methacrylate, AAm: acrylamide Table 13

| Run No. | Prepolymer | | Properties of photopolymerized article | | |
|---|---|---|---|---|---|
| | Polyesterdiol* | Polyetherdiol* | Tensile strength (Kg./cm².) | Shore hardness A | Impact resilience (%) |
| 1 | Polyethylene adipate diol | Polyethylene glycol diol | 125 | 58 | 42 |
| 2 | Poly-1,3-butylene adipate diol | Polypropylene glycol diol | 117 | 54 | 38 |
| 3 | Polypropylene adipate diol | " | 119 | 55 | 40 |
| 4 | Polyethylene adipate diol | Poly-1,4-oxybutylene glycol diol | 120 | 62 | 47 |
| 5 | Polyethylene succinate diol | Polypropylene glycol diol | 136 | 70 | 34 |
| 6 | Poly-γ-methyl-ε-caprolactone diol | " | 113 | 62 | 36 |

Table 13-continued

| Run No. | Polyesterdiol* | Prepolymer Polyetherdiol* | Tensile strength (Kg./cm$^2$.) | Shore hardness A | Impact resilience (%) |
|---|---|---|---|---|---|
| 7 | Poly-δ-valerolactone diol | " | 128 | 68 | 37 |

*Number average molecular weight of about 2,000

Table 14

| Run No. | Diisocyanate | First reaction | Second reaction | Third reaction | Tensile strength (Kg./cm$^2$.) | Shore hardness A | Impact resilience (%) |
|---|---|---|---|---|---|---|---|
| 1 | 2,4-Tolylene diisocyanate | 70°C. × 2 hours | 70°C. × 3 hours | 70°C. × 2 hours | 117 | 60 | 36 |
| 2 | 4,4'-Diphenylmethane diisocyanate | 70°C. × 2 hours | 70°C × 2 hours | 70°C. × 2 hours | 144 | 65 | 34 |
| 3 | m-Xylylene diisocyanate | 85°C. × 2 hours | 85°C. × 2 hours | 85°C. × 2 hours | 119 | 62 | 37 |
| 4 | 1,6-Hexamethylene diisocyanate | 90°C. × 3 hours | 90°C. × 3 hours | 90°C. × 3 hours | 113 | 59 | 45 |

Table 15

| Run No. | Ethylenically unsaturated compound | Shore hardness A | Tensile strength (Kg./cm.$^2$.) | Impact resilience (%) |
|---|---|---|---|---|
| 1 | Trimethylolpropane diacrylate | 64 | 131 | 46 |
| 2 | Allyl alcohol | 50 | 107 | 43 |
| 3 | 2-Hydroxyethyl acrylamide | 63 | 113 | 40 |

Table 16

| Run No. | Prepolymer | St (g.) | HEMA (g.) | VL (g.) | LMA (g.) | MA (g.) | Shore hardness A | Tensile strength (Kg./cm$^2$.) | Impact resilience (%) |
|---|---|---|---|---|---|---|---|---|---|
| 1 | Synthesis 21 | 30 | 2 | 4 | 2 | 4 | 0 | 57 | 108 | 35 |
| 2 | Synthesis 21 | 30 | 0 | 4 | 2 | 5 | 0 | 54 | 105 | 39 |
| 3 | Synthesis 22 | 30 | 0 | 5 | 0 | 3 | 3 | 59 | 121 | 41 |
| 4 | Synthesis 22 | 30 | 2 | 4 | 2 | 0 | 2 | 63 | 113 | 38 |

*St : styrene, HEMA: 2-hydroxyethyl methacrylate VL : vinyl laurate, LMA: lauryl methacrylate MA : methacrylic acid

What is claimed is:

1. A photosensitive composition comprising 1. about 100 parts by weight of at least one prepolymer having a number average molecular weight of about 800 to 20,000 of the formula

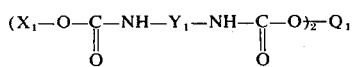  (I)

wherein
$X_1$ represents a residue of an alcohol having one to three ethylenically unsaturated bonds and selected from the group consisting of
a. a compound selected from the group consisting of

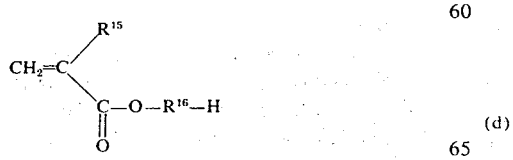  (d)

wherein
$R^{15}$ represents a hydrogen atom or methyl group, $R^{16}$ represents anoxyalkylene group of the formula

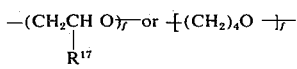

wherein
$R^{17}$ represents a hydrogen atom, methyl, monochloromethyl or monobromomethyl group; and $f$ represents an integer from 1 to 20, b. trimethylolpropane di-acrylate or -methacrylate, glycerine di-acrylate or-methacrylate and pentaerythritol tri-acrylate or -methacrylate, c. allyl alcohol, 2-bromoallyl alcohol 2-chloroalkyl alcohol, glycerol diallylether, trimethylolpropane diallyl ether and allyl vinyl carbinol, and d.

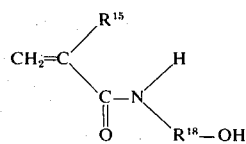

wherein
- $R^{15}$ represents a hydrogen atom or methyl group, and
- $R^{18}$ represents an alkylene having 1 to 12 carbon atoms,
- $Y_1$ represents a residue of a diisocyanate selected from the group consisting of 2,4-tolylene diisocyanate, 2,6-tolylene diisocyanate, a mixture of 2,4-tolylene diisocyanate and 2,6-tolylene disocyanate, 4,4-diphenylmethane diisocyanate, m-xylylene diisocyanate and 1,6-hexamethylene diisocyanate.
- $Q_1$ is a residue of a hydroxy terminated block polymer and is represented by the formula

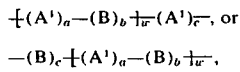

i.
- $A^1$ represents a residue of a polyetherdiol having a number average molecular weight of about 200 to 5,000,
- B. represents a residue of a saturated polyesterdiol having a number average molecular weight of about 200 to 5,000,
- ii. $A^1$ is linked to B; $A^1$ is linked to $A^1$; and B is linked to B with a group having the formula

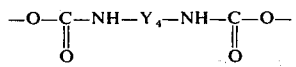

wherein
- $Y_4$ represents a residue of a diisocyanate selected from the group consisting of 2,4-tolylene diisocyanate, 2,6-tolylene diisocyanate, a mixture of 2,4-tolylene diisocyanate and 2,6-tolylene diisocyanate, 4,4-diphenylmethane diisocyanate, m-xylylene diisocyanate and 1,6-hexamethylene diisocyanate,
  - iii. the weight ratio of the total weight of $A^1$ to B is in the range of from about 1:4 to 4:1,
  - (iv) a is an integer from 1 to 4; b is an integer from 1 to 4; c is an integer from 0 to 4; 2 $(a + b)$ w + c    20, 2. 0 to about 120 parts by weight of at least one polymerizable ethylenically unsaturated monomeric compound; and 3. a photopolymerization initiator in an amount of about 0.001 to 10 eight percent of the total weight of the prepolymer (1) and the polymerizable ethylenically unsaturated monomeric compound (2).

2. A photosensitive composition as claimed in claim 1, wherein ($A^1$) is a residue of a polyetherdiol selected from the group consisting of polyethylene glycol diol, polyproplene glycol diol, dihydoxy-terminated ethylene oxide-proplene oxide copolymer and poly-1,4-oxybutylene diol, from which the terminal hydroxy groups are excluded.

3. A photosensitive composition as claimed in claim 2, wherein the dihydroxy-terminated ethylene oxide-propylene oxide copolymer is a dihydoxy-terminated ethylene oxide-propylene oxide block copolymer having about 20 to 80 weight percent of ethylene oxide units or a dihydroxy-terminated ethylene oxide-propylene oxide random copolymer having about 20 to 80 weight percent of ethylene oxide units.

4. A photosensitive composition as claimed in claim 1, wherein ($A^3$) is a residue of polyethylene glycol tetraol from which the terminal hydroxy groups are excluded.

5. A photosensitive composition as claimed in claim 1, wherein (B) is a residue of a polyesterdiol selected from the group consisting of polyethylene adipate diol, polypropylene adipate diol, poly-6-caprolactone diol, poly-γ-methyl-6-caprolactone diol, γ-valerolactone diol, polyethylene succinate diol and poly-1,3-butylene adipate diol, from which the terminal hydroxy groups are excluded.

6. A photosensitive composition as claimed in claim 1, wherein the diisocyanate which links $A^1$ with B, $A^2$ with B, $A^3$ with B, $A^1$ with $A^1$ or B with B is selected from the group consisting of 2,4-tolylene diisocyanate, 2,6-tolylene diisocyanate, a mixture of 2,4-tolylene diisocayanate and 2,6-tolylene diisocyanate, 4,4'-diphenylmethane diisocyanate, m-xylylene diisocyanate and 1,6-hexamethylene diisocyanate.

7. A photosensitive composition as claimed in claim 1, wherein the prepolymer has a number average molecular weight of about 1,300 to 20,000 and the weight ratio of the total weight of $A^1$ to B, is in the range of from about 1:4 to 3:1.

8. A photosensitive composition as claimed in claim 13, wherein $a$ is an integer from 1 to 3; $b$ is an integer from 1 to 3; $c$ is an integer from 0 to 3; and 2 ≦ $(a + b)$ w + c ≦ 10, 9. A photosensitive composition as claimed in claim 8, wherein ($A^1$) is the residue of a dihydroxy-terminated ethylene oxide-propylene oxide copolymer having about 20 to 80 weight percent of ethylene oxide units from which the terminal hydroxy groups are excluded.

10. A photosensitive composition as claimed in claim 8, wherein (B) is the residue of a polypropylene adipate diol from which the terminal hydroxy groups are excluded.

11. A photosensitive composition as claimed in claim 8, wherein $X_1$ is a residue of a compound of the formula

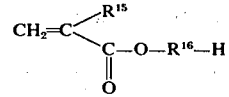

wherein
- $R^{15}$ represents a hydrogen atom or methyl group;
- $R^{16}$ represents an oxyalkylene group of the formula

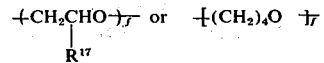

wherein
- $R^{17}$ represents a hydrogen atom, methyl, monochloromethyl or monobromomethyl group;
- $f$ represents an integer of 1 to 20, from which the terminal hydroxy group is excluded.

12. A photosensitive composition as claimed in claim 8, wherein the polymerizable ethylenically unsaturated compound comprises about 10 to 100 parts by weight, based on 100 parts by weight of the prepolymer, of a compound of the formula
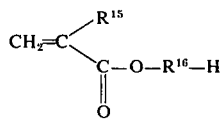
wherein
R$^{15}$ represents a hydrogen atom or methyl group;
R$^{16}$ represents an oxyalkylene group of the formula
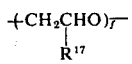
or
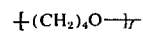
wherein
R$^{17}$ represents a hydrogen atom, methyl, monochloromethyl or monobromomethyl group; and
$f$ represents an integer of 1 to 20.
* * * * *